(12) United States Patent
Moon et al.

(10) Patent No.: US 12,484,307 B2
(45) Date of Patent: Nov. 25, 2025

(54) DISPLAY DEVICE

(71) Applicant: Samsung Display Co., LTD., Yongin-si (KR)

(72) Inventors: Joong-Soo Moon, Hwaseong-si (KR); Chang-Yeol Lee, Suwon-si (KR); Won Kyu Kwak, Seongnam-si (KR); Ji Su Na, Yongin-si (KR); Bong Won Lee, Seoul (KR); Jin Tae Jeong, Suwon-si (KR)

(73) Assignee: Samsung Display Co., LTD., Gyeonggi-do (KR)

( * ) Notice: Subject to any disclaimer, the term of this patent is extended or adjusted under 35 U.S.C. 154(b) by 511 days.

(21) Appl. No.: 18/091,440

(22) Filed: Dec. 30, 2022

(65) Prior Publication Data

US 2023/0282653 A1    Sep. 7, 2023

(30) Foreign Application Priority Data

Mar. 3, 2022    (KR) .................. 10-2022-0027722

(51) Int. Cl.
*H01L 27/12*   (2006.01)
*H10D 86/40*   (2025.01)
*H10D 86/60*   (2025.01)
*H01L 25/16*   (2023.01)

(52) U.S. Cl.
CPC .......... *H10D 86/60* (2025.01); *H10D 86/443* (2025.01); *H01L 25/167* (2013.01)

(58) Field of Classification Search
CPC .... H10D 86/60; H10D 86/443; H10D 86/423; H10D 86/441; H10D 86/471; H01L 25/167; H01L 23/60; H10K 59/131; H10K 59/126; H10K 50/865; H10K 59/88
See application file for complete search history.

(56) References Cited

FOREIGN PATENT DOCUMENTS

| KR | 10-0860643 | 9/2008 |
|---|---|---|
| KR | 10-2016-0129174 | 11/2016 |
| KR | 10-2017-0049705 | 5/2017 |
| KR | 10-2019-0002931 | 1/2019 |
| KR | 10-2246382 | 4/2021 |

*Primary Examiner* — Elmito Breval
(74) *Attorney, Agent, or Firm* — Harness, Dickey & Pierce, P.L.C.

(57) ABSTRACT

A display device includes: a substrate including a display area and a non-display area; a light blocking layer disposed on the substrate; and a semiconductor layer disposed on the light blocking layer, wherein the light blocking layer includes a plurality of flat plate portions disposed in the display area, a first connector connected to the flat plate portions in a first direction, a second connector connected to the flat plate portions in a second direction perpendicular to the first direction, and an outer portion disposed in the non-display area, and the first connector and the outer portion are directly connected to each other, and a width of the outer portion is greater than a width of the first connector.

20 Claims, 22 Drawing Sheets

DISPLAY DEVICE

CROSS-REFERENCE TO RELATED APPLICATION(S)

This application claims priority to and benefits of Korean Patent Application No. 10-2022-0027722 under 35 U.S.C. § 119, filed on Mar. 3, 2022, in the Korean Intellectual Property Office (KIPO), the entire contents of which are incorporated herein by reference.

BACKGROUND

1. Technical Field

Embodiments relate to a display device.

2. Description of the Related Art

A display device is a device that displays an image. Recently, an organic light emitting diode display, which is a type of emissive display device, has been attracting attention.

An emissive display device has a self-emissive characteristic, and does not require a light source, unlike a liquid crystal display (LCD) device. Thus, the emissive display device may be fabricated to be thinner and lighter. Further, the emissive display device has high quality characteristics such as low power consumption, high luminance, high response speed, and the like.

In general, a light emitting diode display includes a substrate, thin film transistors disposed on the substrate, insulating layers disposed between wires, and organic light emitting elements connected to the thin film transistors.

The above information disclosed in this Background section is only for enhancement of understanding of the background of the invention, and therefore, it may contain information that does not constitute the prior art.

SUMMARY

Embodiments provide a display device capable of preventing bright spots from being generated due to inflow of external static electricity.

An embodiment provides a display device including: a substrate including a display area and a non-display area; a light blocking layer disposed on the substrate; and a semiconductor layer disposed on the light blocking layer, wherein the light blocking layer includes a plurality of flat plate portions disposed in the display area, a first connector connected to the flat plate portions in a first direction, a second connector connected to the flat plate portions in a second direction perpendicular to the first direction, and an outer portion disposed in the non-display area, and the first connector and the outer portion are directly connected to each other, and a width of the outer portion may be greater than a width of the first connector.

The outer portion may have a ring shape surrounding the display area.

The second connector may not be directly connected to the outer portion.

The plurality of flat plate portions of the light blocking layer may overlap the semiconductor layer in a thickness direction of the substrate.

The display device may further include dummy pixels disposed at opposite edges of the display area in the first direction; and pixels disposed between the dummy pixels in the first direction.

A width of the outer portion may be in a range of about 250 μm to about 350 μm.

A width of the first connector may be in a range of about 30 μm to about 80 μm.

The display device may further include a driving voltage line overlapping the outer portion.

A width of the driving voltage line may be in a range of about 250 μm to about 350 μm.

A width of the outer portion may be greater than or equal to a width of the driving voltage line.

The display device may further include an insulating layer disposed between the outer portion and the driving voltage line, the outer portion and the driving voltage line may be connected in a first opening of the insulating layer, and the outer portion may receive a driving voltage.

The display device may further include an outer semiconductor layer disposed between the outer portion and the driving voltage line.

The outer semiconductor layer may not overlap the first opening of the insulating layer.

The outer semiconductor layer may have a second opening, and the first opening of the insulating layer may overlap the second opening of the outer semiconductor layer.

A distance between the second opening of the outer semiconductor layer and an edge of the outer semiconductor layer may be in a range of about 3 μm to about 5 μm.

A distance between the first opening of the insulating layer and the second opening of the outer semiconductor layer may be in a range of about 3 μm to about 5 μm.

A width of the outer semiconductor layer may be in a range of about 20 μm to about 40 μm.

The semiconductor layer may include a polycrystalline semiconductor layer.

The display device may further include an oxide semiconductor layer disposed in the display device.

The display device may further include a wire overlapping the outer portion.

According to the embodiments, a display device is capable of preventing bright spots from being generated due to inflow of external static electricity.

DETAILED DESCRIPTION OF THE EMBODIMENTS

Figure 1:
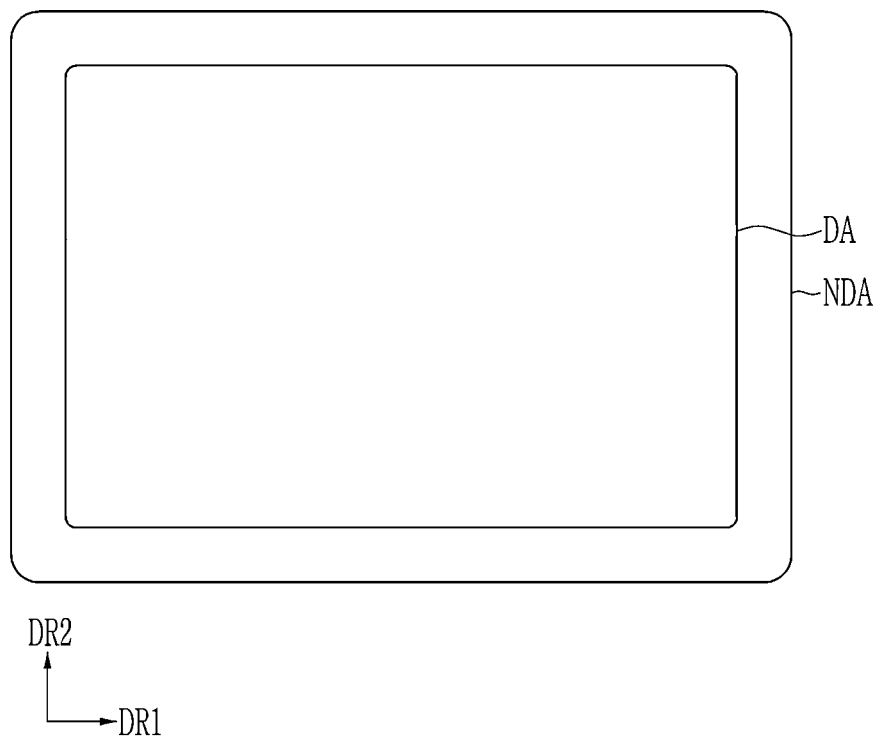
FIG. 1 schematically illustrates a display device according to an embodiment.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods disclosed herein. It is apparent, however, that various embodiments may be practiced without these specific details or with one or more equivalent arrangements. Here, various embodiments do not have to be exclusive nor limit the disclosure. For example, specific shapes, configurations, and characteristics of an embodiment may be used or implemented in another embodiment.

Unless otherwise specified, the illustrated embodiments are to be understood as providing features of the invention. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the X, Y, and Z-axes, and may be interpreted in a broader sense. For example, the DR1-axis, the DR2-axis, and the DR3-axis may be perpendicular to one another, or may represent different directions that are not perpendicular to one another. Further, the X-axis, the Y-axis, and the Z-axis are not limited to three axes of a rectangular coordinate system, such as the x, y, and z axes, and may be interpreted in a broader sense. For example, the X-axis, the Y-axis, and the Z-axis may be perpendicular to one another, or may represent different directions that are not perpendicular to one another. For the purposes of this disclosure, "at least one of A and B" may be construed as understood to mean A only, B only, or any combination of A and B. Also, "at least one of X, Y, and Z" and "at least one selected from the group consisting of X, Y, and Z" may be construed as X only, Y only, Z only, or any combination of two or more of X, Y, and Z. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Hereinafter, a display device according to an embodiment will be described in detail with reference to the drawings.

FIG. 1 schematically illustrates a display device according to an embodiment. Referring to FIG. 1, the display device according to an embodiment may include a display area DA and a non-display area NDA. The display area DA may be an area in which transistors and light emitting devices connected to the transistors are positioned to display an image, and the non-display area NDA may be an area in which wires and the like connected to the transistors are positioned and an image is not displayed.

Figure 2:
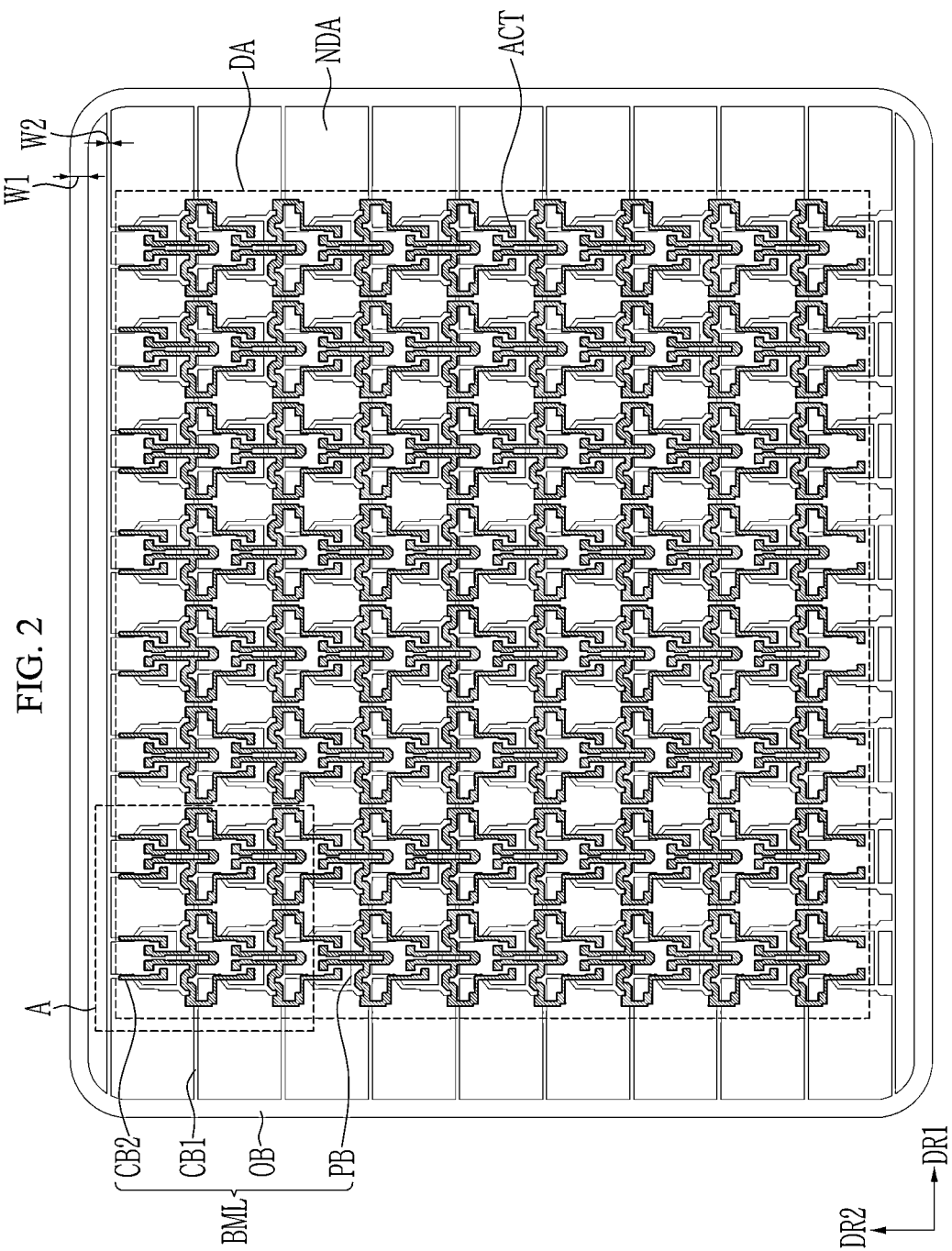
FIG. 2 illustrates a semiconductor layer and a light blocking layer in a display area and a non-display in a display device according to an embodiment.

FIG. 2 illustrates a semiconductor layer ACT and a light blocking layer BML in a display area DA and a non-display area NDA in a display device according to an embodiment.

Referring to FIG. 2, in the display device according to an embodiment, a light blocking layer BML may be positioned in the display area DA. The light blocking layer BML may be positioned to overlap a portion of the semiconductor layer ACT. For example, the light blocking layer BML may be positioned to overlap a driving transistor of the semiconductor layer ACT, and a detailed structure will be separately described below. The light blocking layer BML may block light incident on the semiconductor layer ACT to enable the transistors to stably and properly operate.

Figure 3:
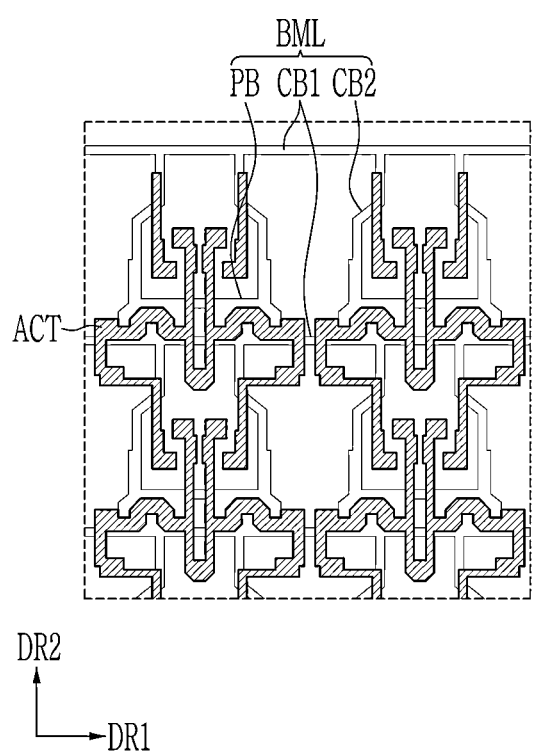
FIG. 3 illustrates a schematic enlarged view of a portion indicated by "A" in FIG. 2.

The display area DA of FIG. 2 may include pixels. For example, light blocking layers positioned in each pixel may be connected to each other in the first direction DR1 and the second direction DR2. FIG. 3 illustrates a schematic view of a portion indicated by "A" in FIG. 2. Referring to FIG. 2 and FIG. 3, the light blocking layer BML positioned in each pixel PX may include a flat plate portion PB having a flat surface shape with a specific area. The flat plate portion PB may overlap the semiconductor layer ACT. For example, the flat plate portion PB positioned in each pixel PX may be connected to the flat plate portion PB positioned in a neighboring pixel PX in the first direction DR1 through a first connector CB1 that is parallel to the first direction DR1. For example, the flat plate portion PB positioned in each pixel PX may be connected to the flat plate portion PB positioned in a neighboring pixel PX in the second direction DR2 through a second connector CB2 that is parallel to the second direction DR2.

Referring back to FIG. 2, the light blocking layer BML positioned in each pixel in the display area DA may be connected to the light blocking layer BML of a neighboring pixel through the first connector CB1 and the second connector CB2. The first connector CB1 may extend to the non-display area NDA. The outer portion OB connecting first connectors CB1 may be positioned in the non-display area NDA. As illustrated in FIG. 2, the outer portion OB may be positioned in the non-display area NDA along a circumference of the display area DA.

For example, as illustrated in FIG. 2, the light blocking layer BML according to an embodiment may include the flat plate portion PB positioned in the display area DA to overlap the semiconductor layer ACT, the first connector CB1 and the second connector CB2 connecting adjacent flat plate portions PB, and the outer portion OB positioned in the non-display area NDA. The outer portion OB may be connected to the first connector CB1 extending to the non-display area NDA. Referring to FIG. 2, light blocking layers BML may be connected to each other in an entire area of the display device. In the display area DA, the light blocking layers BML may be connected in a mesh shape including the first connector CB1 and the second connector CB2, and in the non-display area NDA, the light blocking layers BML may be connected through the outer portion OB. Accordingly, in case that a voltage is applied to a portion of the light blocking layer BML, a same voltage may be applied to an entire region of the light blocking layer BML. A specific voltage application configuration will be described below.

Referring to FIG. 2, a width W1 of the outer portion OB may be wider than a width W2 of the first connector CB1. Since the width W1 of the outer portion OB is wide, wires that applies a voltage to the light blocking layer BML may be readily contact each other, and the applied voltage may be well transferred to the entire area of the display device. Since the outer portion OB is positioned in the non-display area NDA, even in case that the width W1 of the outer portion OB is increased, the display quality may not be affected. However, in case that the width W2 of the first connector CB1 positioned in the display area DA is increased, unintended capacitance may be formed with other wires in the display area DA.

Referring to FIG. 2, the width W1 of the outer portion OB may be in a range of about 250 μm to about 350 μm. For example, the width W2 of the first connector CB1 may be in a range of about 30 μm to about 80 μm. For example, the width W2 of the first connector CB1 may be about 10% to about 50% of the width W1 of the outer portion OB.

Referring to FIG. 2, in the display device according to an embodiment, the first connector CB1 of the light blocking layer BML may be directly connected to the outer portion OB, and the second connector CB2 may not directly connected to the outer portion OB. For example, the first connector CB1 extending in the first direction DR1 may be directly connected to the outer portion OB that is parallel therewith in the second direction DR2, but the second connector CB2 extending in the second direction DR2 may not be directly connected to the outer portion OB. For example, the second connector CB2 may not be directly connected to the outer portion OB extending in the first direction DR1.

As such, since the second connector CB2 extending in the second direction DR2 is not directly connected to the outer portion OB, a defect, in which external static electricity flows into the display area DA to generate a bright spot, may be prevented.

Figure 4:
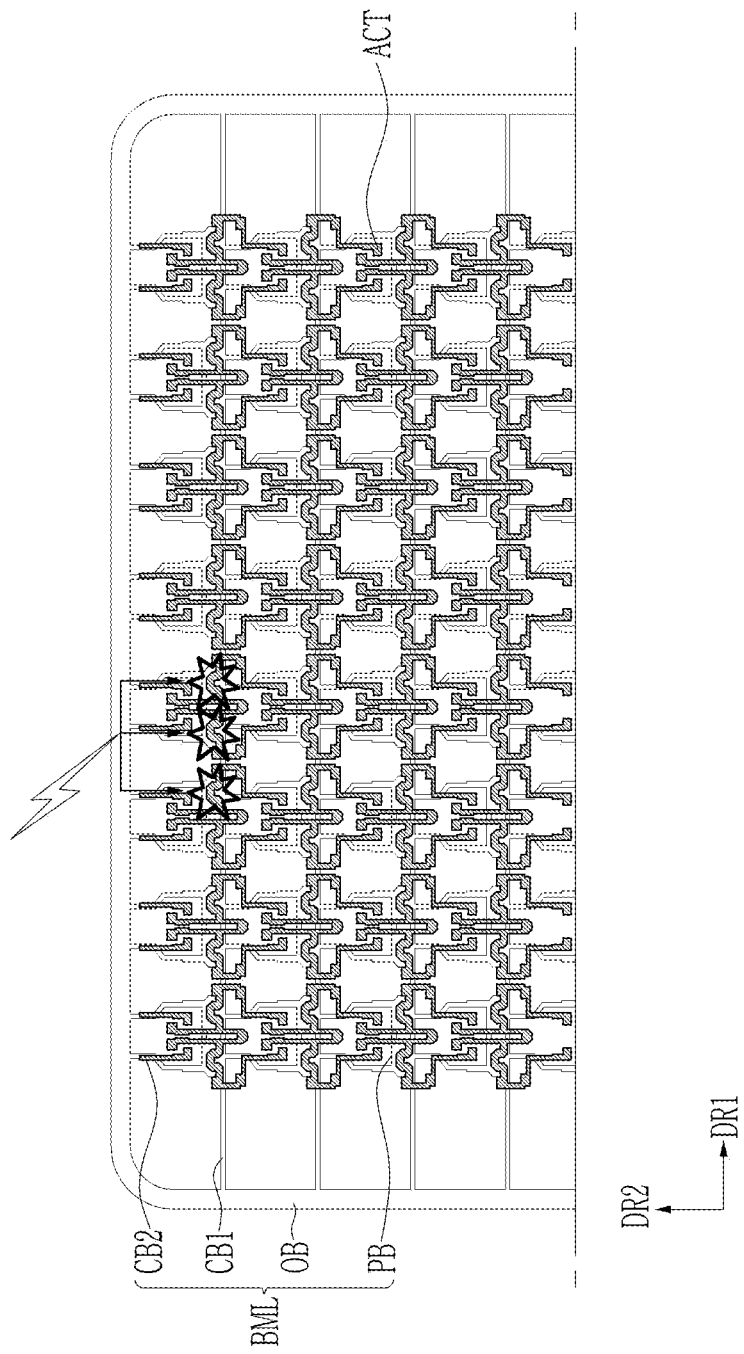
FIG. 4 illustrates a configuration in which external static electricity flows into a display area in a comparative example in which a second connector is directly connected to an outer portion.
Figure 5:
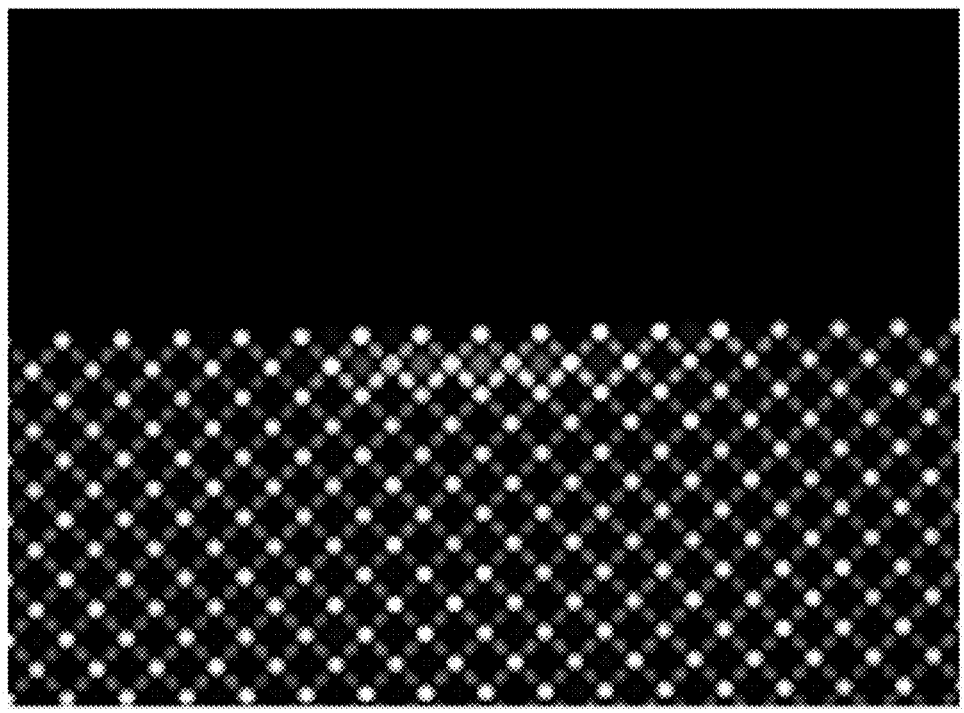
FIG. 5 illustrates an image of a pixel in which bright spots are generated.
Figure 6:
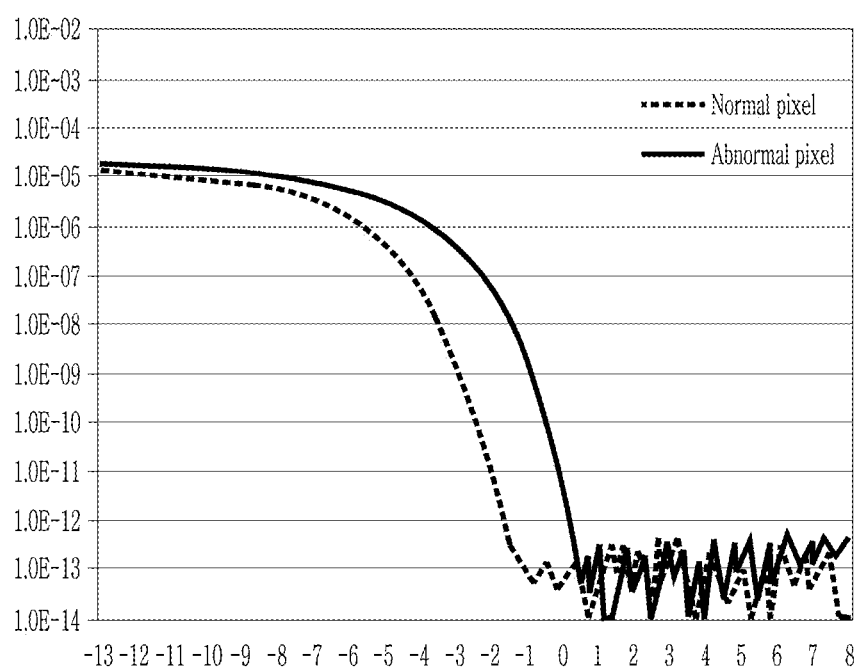
FIG. 6 illustrates threshold voltages of a normal pixel and an abnormal pixel in which bright spots are generated.

FIG. 4 illustrates a configuration in which external static electricity flows into the display area DA in a comparative example in which a second connector CB2 is directly connected to an outer portion OB. Referring to FIG. 4, in case that the second connector CB2 that is parallel to the second direction DR2 is directly connected to the outer portion OB, static electricity flowing thereto through the outer portion OB may be transferred to pixels of the display area DA along the second connector CB2. In FIG. 4, this flow of static electricity is indicated by arrows. As illustrated in FIG. 4, in case that static electricity is introduced (e.g., directly introduced) into the display area DA, a threshold voltage of a transistor of a pixel may be shifted (e.g., positively shifted), and the shifted threshold voltage of the transistor may cause a bright spot. FIG. 5 illustrates an image of a pixel in which bright spots are generated. FIG. 6 illustrates threshold voltages of a normal pixel and an abnormal pixel in which bright spots are generated. Referring to FIG. 6, in case that external static electricity is introduced, the threshold voltage of the transistor may be shifted to the right direction (or a positive shifting direction). In case that the threshold voltage of the transistor is shifted in a such way, the pixel may express (or display) a bright spot as illustrated in FIG. 5.

Figure 7:
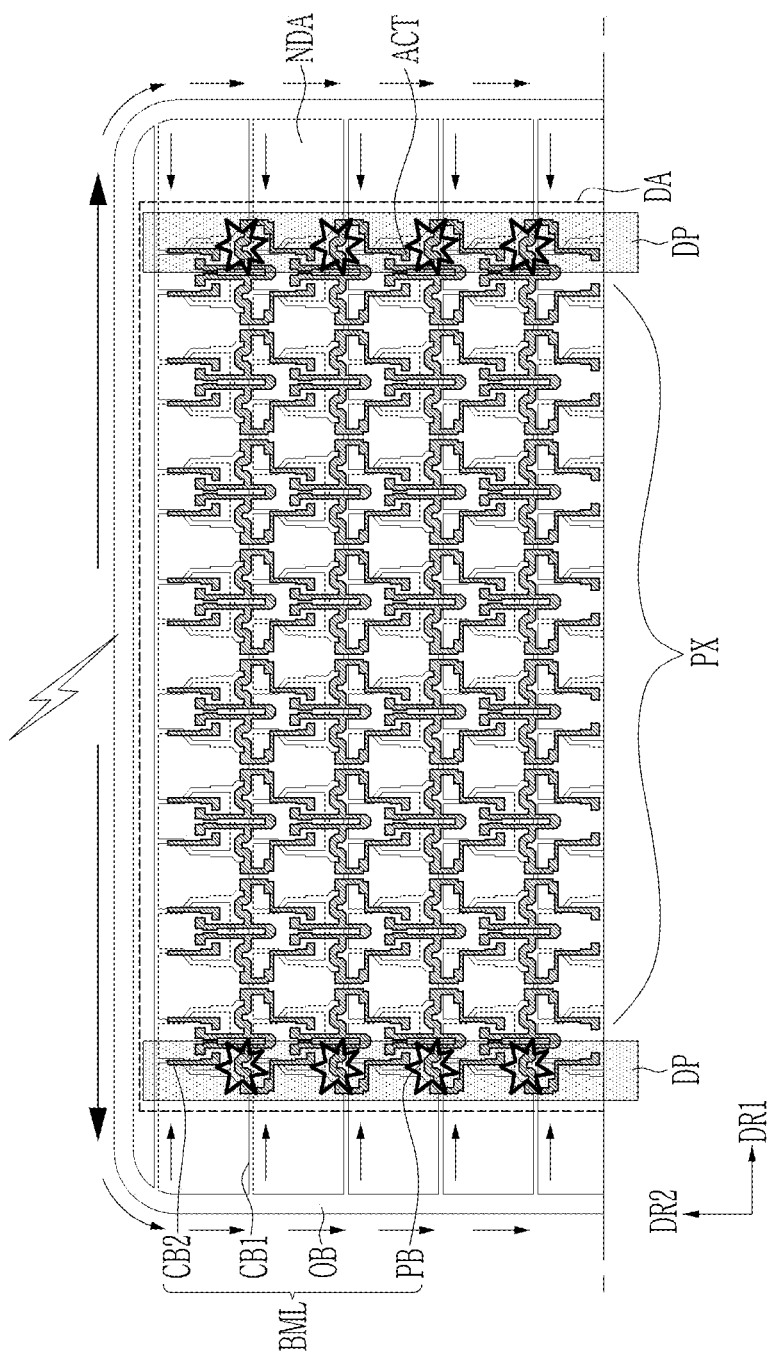
FIG. 7 illustrates a path through which static electricity is introduced in a display device according to an embodiment.

However, in the case of the display device according to an embodiment, the outer portion OB and the second connector CB2 may not be directly connected. Accordingly, static electricity introduced from the outer portion OB may be bypassed rather than being introduced (e.g., directly introduced) into the display area DA, and bright spots caused by the external static electricity may be prevented. FIG. 7 illustrates a path through which static electricity is introduced in a display device according to an embodiment. Referring to FIG. 7, static electricity introduced from the outer portion OB may be bypassed through left and right sides of the outer portion OB and then may flow into the display area DA. For example, dummy pixels DP may be positioned at left and right edges (or left and right sides) of the display area DA in the first direction DR1. For example, pixels PX may be disposed between the dummy pixels DP in the first direction DR1. Since the dummy pixel DP is a pixel that does not substantially display an image, even in case that static electricity is introduced, a bright spot may not be expressed or displayed. For example, in an embodiment, in case that static electricity is generated in the outer portion OB, damage caused by static electricity may be prevented, and bright spots caused by static electricity may be prevented.

Figure 8:
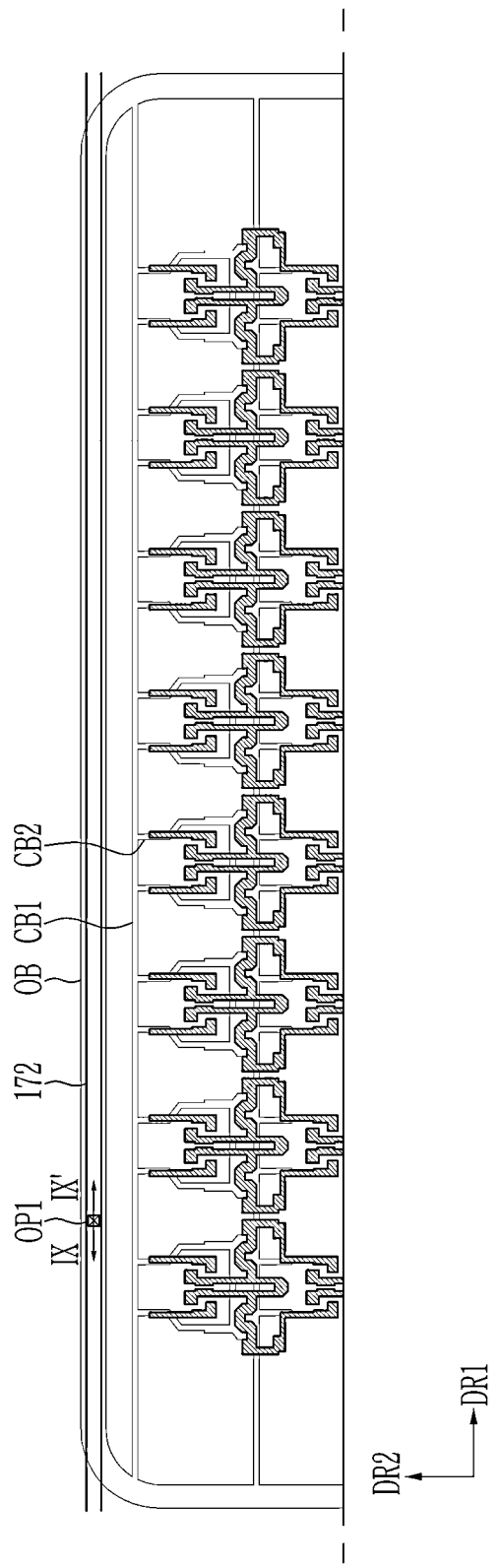
FIG. 8 illustrates a light blocking layer and a driving voltage line.

Referring to FIG. 8, in the display device according to an embodiment, the light blocking layer BML may be positioned to overlap a driving voltage line 172, and may receive a driving voltage ELVDD from the driving voltage line 172. The light blocking layer BML and the driving voltage line 172 may be in contact with the outer portion OB, the driving voltage transferred to the outer portion OB may be transferred to the light blocking layer BML positioned in the display area DA through the first connector CB1 connected to the outer portion OB.

FIG. 8 illustrates a light blocking layer BML and a driving voltage line 172. Referring to FIG. 8, the outer portion OB of the light blocking layer BML and the driving voltage line 172 may overlap. In the opening OP1 illustrated in FIG. 8, the light blocking layer BML (e.g., the outer portion OB) and the driving voltage line 172 may contact each other.

Figure 9:
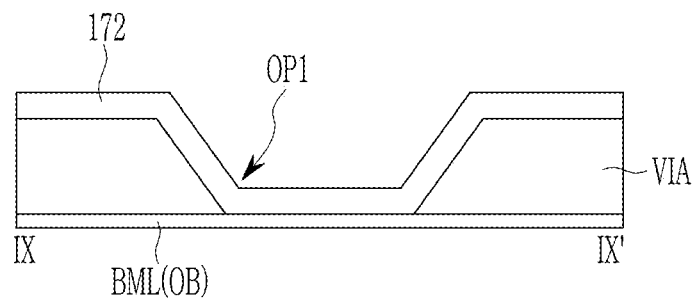
FIG. 9 illustrates a schematic cross-sectional view taken along line IX-IX' of FIG. 8.

FIG. 9 illustrates a schematic cross-sectional view taken along line IX-IX' of FIG. 8. Referring to FIG. 9, the insulating layer VIA may be positioned between the light blocking layer BML (e.g., the outer portion OB) and the driving voltage line 172, and the driving voltage line 172 and the light blocking layer BML may be in contact with the opening OP1 of the insulating layer VIA. Accordingly, the driving voltage ELVDD may be applied from the driving voltage line 172.

FIG. 8 and FIG. 9 disclose a configuration in which the insulating layer VIA is positioned between the light blocking layer BML (e.g., the outer portion OB) and the driving voltage line 172, but according to an embodiment, an outer semiconductor layer ACT_NDA may be positioned between the light blocking layer BML and the driving voltage line 172.

Figure 10:
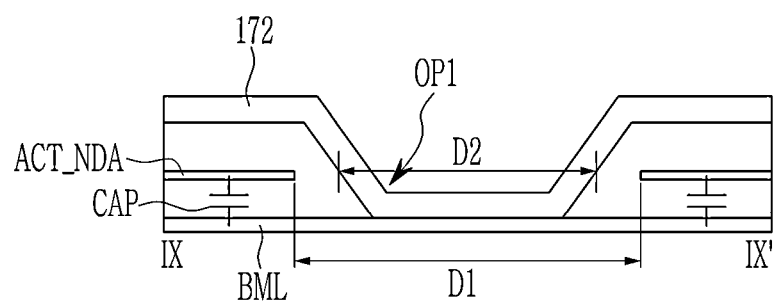
FIG. 10 illustrates a cross-section corresponding to that of FIG. 9 for a display device according to an embodiment.

FIG. 10 illustrates a cross-section corresponding to that of FIG. 9 for a display device according to an embodiment. Referring to FIG. 10, the outer semiconductor layer ACT_NDA may be positioned between the light blocking layer BML and the driving voltage line 172. The outer semiconductor layer ACT_NDA positioned therebetween may form a capacitor CAP between the outer semiconductor layer ACT_NDA and the light blocking layer BML. As such, in case that the outer semiconductor layer ACT_NDA is positioned between the light blocking layer BML and the driving voltage line 172, a peak level of static electricity may be reduced by the capacitor CAP formed between the outer semiconductor layer ACT_NDA and the light blocking layer BML. For example, since the introduced static electricity is not directly transferred along the light blocking layer BML, but is stored in the capacitor CAP formed between the outer semiconductor layer ACT_NDA and the light blocking layer BML, damage to the display area DA due to a sudden inflow of static electricity may be prevented. In an embodiment, the outer semiconductor layer ACT_NDA may not be exposed through the opening OP1 of the insulating layer VIA. For example, a distance D1 between the adjacent outer semiconductor layers ACT_NDA may be greater than the width (or diameter) D2 of the opening OP1 of the insulating layer VIA.

For example, the outer semiconductor layer ACT_NDA positioned in the non-display area and the semiconductor layer ACT of the display area may be formed by a same process, may be positioned on a same layer, and may include a same material. For example, the outer semiconductor layer ACT_NDA and the semiconductor layer ACT may include crystalline silicon.

Figure 11:
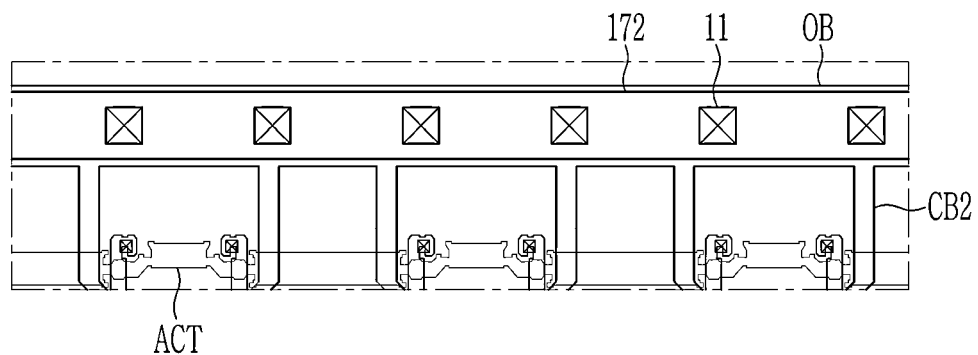
FIG. 11 illustrates a configuration of the outer portion of a light blocking layer and a semiconductor layer in the embodiment of FIG. 4.

FIG. 11 illustrates a configuration of the outer portion OB of the light blocking layer BML and the semiconductor layer ACT in the embodiment of FIG. 4. Referring to FIG. 11, in an embodiment, the outer portion OB of the light blocking layer BML may be connected to the second connector CB2. Accordingly, static electricity introduced from the outer portion OB may easily penetrate into the display area DA. Referring to FIG. 11, the driving voltage line 172 may overlap the outer portion OB of the light blocking layer BML. The driving voltage line 172 and the light blocking layer BML may be in contact with each other through contact holes 11.

Figure 12:
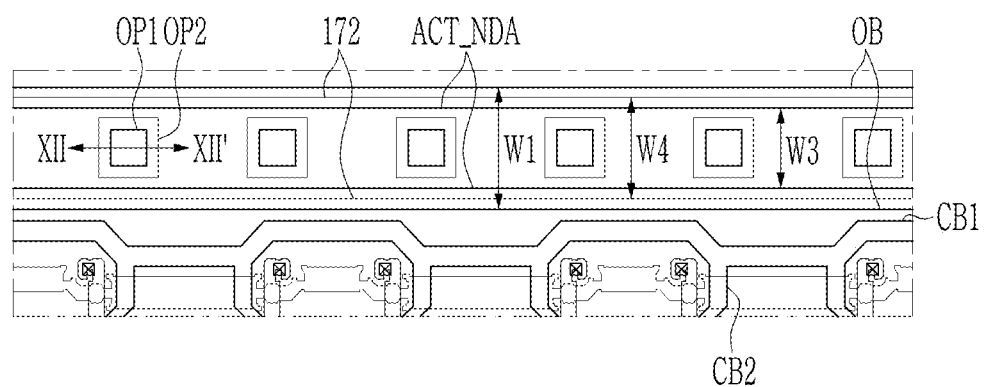
FIG. 12 illustrates a configuration of an outer portion of a light blocking layer and a semiconductor layer according to an embodiment.

FIG. 12 illustrates a configuration of the outer portion OB of the light blocking layer BML and the semiconductor layer ACT according to an embodiment. Referring to FIG. 12, in an embodiment, the outer portion OB of the light blocking layer BML may not be connected to the second connector CB2. Accordingly, as described above, static electricity introduced from the outer portion OB may not easily penetrate into the display area DA.

In FIG. 12, the driving voltage line 172 may overlap the outer portion OB of the light blocking layer BML. For example, the outer semiconductor layer ACT_NDA positioned between the light blocking layer BML and the driving voltage line 172 is illustrated. The driving voltage line 172 and the light blocking layer BML may be in contact with each other through the opening OP1 positioned in the insulating layer. Accordingly, the light blocking layer BML may receive the driving voltage ELVDD from the driving voltage line 172.

A width W3 of the outer semiconductor layer ACT_NDA overlapping the outer portion OB may be in a range of about 20 µm to about 40 µm. For example, as described above, the width W1 of the outer portion OB may be in range of about 250 µm to about 350 µm. As illustrated in FIG. 12, a width W4 of the driving voltage line 172 may be less than or equal to the width W1 of the outer portion OB. For example, the width W4 of the driving voltage line 172 may be in a range of about 250 µm to about 350 µm. The width W4 of the driving voltage line 172 may be greater than the width W3 of the outer semiconductor layer ACT_NDA.

A cross-section taken along line XII-XII' of FIG. 12 may be substantially the same as that of FIG. 10. For example, the outer semiconductor layer ACT_NDA may not be exposed through the opening OP1 of the insulating layer VIA. For example, the distance D1 of the outer semiconductor layer ACT_NDA may be greater than the width D2 of the opening OP1 of the insulating layer VIA.

In FIG. 12, the opening OP2 of the outer semiconductor layer ACT_NDA and the opening OP1 of the insulating layer VIA are illustrated. As illustrated in FIG. 12, since a size of the opening OP2 of the outer semiconductor layer ACT_NDA is larger than that of the opening OP1 of the insulating film VIA, the outer semiconductor layer ACT_NDA on a side surface of the insulating layer VIA may not be exposed. As illustrated in FIG. 10, the outer semiconductor layer ACT_NDA may form a capacitor CAP between the outer semiconductor layer ACT_NDA and the light blocking layer BML (e.g., the outer portion OB), and may prevent damage of the display area DA due to a sudden inflow of static electricity.

Figure 13:
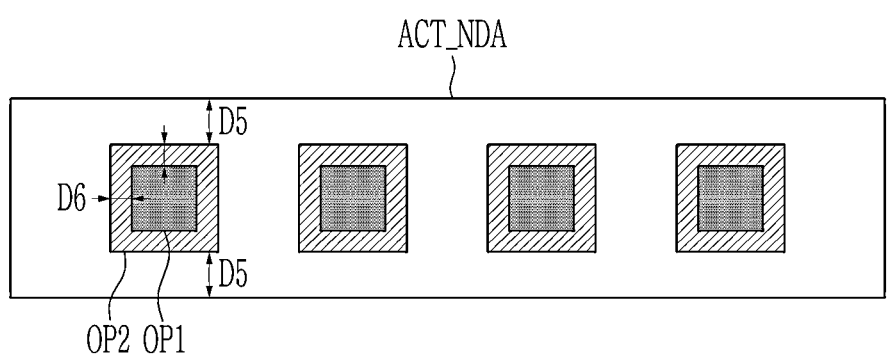
FIG. 13 illustrates a distance between an opening of an outer semiconductor layer and an edge of the outer semiconductor layer and a distance between the opening of the outer semiconductor layer and an opening of an insulating layer.

FIG. 13 illustrates a distance D5 between an opening OP1 of an outer semiconductor layer ACT_NDA and an edge of the outer semiconductor layer ACT_NDA and a distance D6 between an opening OP2 of the outer semiconductor layer ACT_NDA and an opening OP1 of the insulating layer VIA. A distance D5 between the opening OP1 of the outer semiconductor layer ACT_NDA and an edge of the outer semiconductor layer ACT_NDA may be in a range of about 3 µm to about 5 µm. The range of about 3 µm to about 5 µm of the distance D5 may be a range in which the outer semiconductor layer ACT_NDA does not affect the contact between the light blocking layer BML and the driving voltage line 172 with an effect of forming a capacitor by the outer semiconductor layer ACT_NDA. A distance D6 between the opening OP2 of the outer semiconductor layer ACT_NDA and the opening OP1 of the insulating layer VIA may be in a range of about 3 µm to about 5 µm. The range of about 3 µm to about 5 µm of the distance D6 may be a range in which the outer semiconductor layer ACT_NDA is stably covered by the insulating layer VIA so as to not affect the contact between the light blocking layer BML and the driving voltage line 172.

Hereinafter, pixels positioned in the display area DA will be described with reference to FIG. 14 to FIG. 22. However, a structure described below are only examples, and embodiments are not limited thereto.

Figure 14:
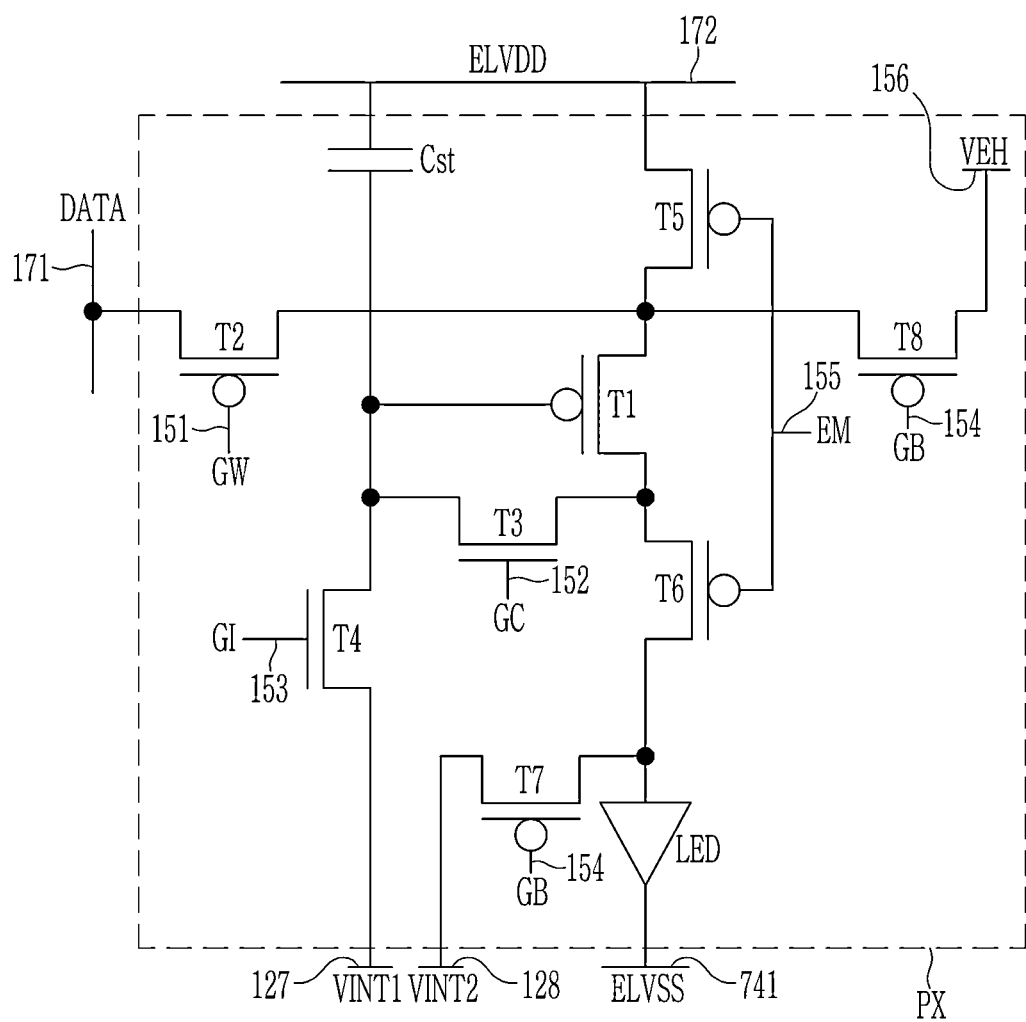
FIG. 14 illustrates a schematic diagram of an equivalent circuit of a pixel of a display device according to an embodiment.

FIG. 14 illustrates a schematic diagram of an equivalent circuit of a pixel of a display device according to an embodiment. As illustrated in FIG. 14, according to an embodiment, the pixel PX (e.g., a single pixel) of the display device may include transistors T1, T2, T3, T4, T5, T6, T7, and T8, a storage capacitor Cst, and a light emitting diode LED connected to various signal lines.

Signal lines 127, 128, 151, 152, 153, 154, 155, 156, 171, 172, and 741 may be connected to the pixel PX. The signal lines include a first initialization voltage line 127, a second initialization voltage line 128, a first scan line 151, a second scan line 152, an initialization control line 153, a bypass control line 154, an emission control line 155, a reference voltage line 156, a data line 171, a driving voltage line 172, and a common voltage line 741.

The first scan line 151 may be connected to a gate driver to transfer a first scan signal GW to the second transistor T2. a signal applied to the first scan line 151 and a signal applied to the second scan line 152 may be supplied at a same timing, and may have opposite phases from each other. For example, in case that a high voltage is applied to the first scan line 151, a low voltage may be applied to the second scan line 152. The second scan line 152 may transmit a second scan signal GC to the third transistor T3.

The initialization control line 153 may transmit an initialization control signal GI to the fourth transistor T4. The bypass control line 154 may transfer a bypass signal GB to the seventh transistor T7 and the eighth transistor T8. The bypass control line 154 may be formed by a next-stage first scan line 151. The emission control line 155 may transmit an emission control signal EM to the fifth transistor T5 and the sixth transistor T6.

The data line 171 may be a wire for transmitting a data voltage DATA generated by a data driver, and luminance of the organic light emitting diode LED that emits light is changed according to the data voltage DATA applied to the pixel PX.

The driving voltage line 172 applies a driving voltage ELVDD, and the reference voltage line 156 applies a reference voltage VEH. The first initialization voltage line 127 may transfer a first initialization voltage VINT1, and the second initialization voltage line 128 may transfer the second initialization voltage VINT2. The common voltage line 741 applies a common voltage ELVSS to a cathode of the light emitting diode LED. In an embodiment, voltages applied to the driving voltage line 172, the reference voltage line 156, the first and second initialization voltage lines 127 and 128, and the common voltage line 741 may be constant voltages, respectively.

Hereinafter, a structure and connection relationship of the transistors will be described in detail.

The driving transistor T1 may have a p-type transistor characteristic, and may include a polycrystalline semiconductor. The driving transistor T1 may receive a data voltage DATA according to a switching operation of the second transistor T2, and may supply a driving current to an anode of the light emitting diode LED. A brightness of the light emitting diode LED may be adjusted according to a magnitude of the driving current outputted to the anode electrode of the light emitting diode LED, and thus the brightness of the light emitting diode LED may be adjusted according to the data voltage DATA applied to the pixel PX. For example, a first region of the driving transistor T1 may be connected to the driving voltage line 172 via the fifth transistor T5 by being positioned to receive the driving voltage ELVDD. For example, the first region of the driving transistor T1 may be also connected to a second region of the second transistor T2 to receive the data voltage DATA. For example, a second region of the driving transistor T1 may be positioned to output a current toward the light emitting diode LED, and may be connected to an anode of the light emitting diode LED via the sixth transistor T6. For example, the second region of the driving transistor T1 may transfer the data voltage DATA applied to the first region to the third transistor T3. For example, a gate electrode of the driving transistor T1 may be connected to a first electrode (hereinafter, referred to as a 'second storage electrode') of the storage capacitor Cst. Accordingly, the voltage of the gate electrode of the driving transistor T1 may be changed according to a voltage stored in the storage capacitor Cst, and a driving current outputted by the driving transistor T1 may be changed. For example, the storage capacitor Cst may function to maintain a voltage of the gate electrode of the driving transistor T1 to be constant during one frame.

The second transistor T2 may have a p-type transistor characteristic, and may include a polycrystalline semiconductor. The second transistor T2 may be a transistor that receives the data voltage DATA into the pixel PX. A gate electrode of the second transistor T2 may be connected to the first scan line 151. A first region of the second transistor T2 may be connected to the data line 171. The second region of the second transistor T2 may be connected to the first region of the driving transistor T1. In case that the second transistor T2 is turned on by a low voltage of the first scan signal GW transferred through the first scan line 151, the data voltage DATA transferred through the data line 171 may be transferred to the first region of the driving transistor T1.

The third transistor T3 may have an n-type transistor characteristic, and may include an oxide semiconductor. The third transistor T3 may connect (e.g., electrically connect) the second region of the driving transistor T1 and the gate electrode of the driving transistor T1. As a result, the third transistor T3 may be a transistor in which a compensation voltage generated by changing the data voltage DATA through the driving transistor T1 is transferred to the second storage electrode of the storage capacitor Cst. A gate electrode of the third transistor T3 may be connected to the second scan line 152, and a first region of the third transistor T3 may be connected to the second region of the driving transistor T1. The second region of the third transistor T3 may be connected to the second storage electrode of the storage capacitor Cst and the gate electrode of the driving transistor T1. The third transistor T3 may be turned on by a high voltage among the second scan signals GC received through the second scan line 152, to connect the gate electrode of the driving transistor T1 and the second region of the driving transistor T1, and the voltage applied to the gate electrode of the driving transistor T1 may be transferred to the second storage electrode of the storage capacitor Cst and stored in the storage capacitor Cst.

The four transistor T4 may have an n-type transistor characteristic, and may include an oxide semiconductor. The fourth transistor T4 may function to initialize the gate electrode of the driving transistor T1 and the second storage electrode of the storage capacitor Cst. The gate electrode of the fourth transistor T4 may be connected to the initialization control line 153, and a first region of the fourth transistor T4 may be connected to the first initialization voltage line 127. A second region of the fourth transistor T4 may be connected to the second storage electrode of the storage capacitor Cst and the gate electrode of the driving transistor T1 via the second region of the third transistor T3. The fourth transistor T4 may be turned on by a high voltage of the initialization control signal GI transferred through the initialization control line 153. For example, the first initialization voltage VINT1 may be transferred to the gate electrode of the driving transistor T1 and the second storage electrode of the storage capacitor Cst. Accordingly, a voltage of the gate electrode of the driving transistor T1 and the storage capacitor Cst may be initialized.

The fifth transistor T5 may have a p-type transistor characteristic, and may include a polycrystalline semiconductor. The fifth transistor T5 may function to transfer the driving voltage ELVDD to the driving transistor T1. A gate electrode of the fifth transistor T5 may be connected to the emission control line 155, a first region of the fifth transistor T5 may be connected to the driving voltage line 172, and a second region of the fifth transistor T5 may be connected to the first region of the driving transistor T1.

The sixth transistor T6 may have a p-type transistor characteristic, and may include a polycrystalline semiconductor. The sixth transistor T6 may function to transfer a driving current outputted from the driving transistor T1 to the light emitting diode. The gate electrode of the sixth transistor T6 may be connected to the emission control line 155, a first region of the sixth transistor T6 may be connected to the second region of the driving transistor T1, and a second region of the sixth transistor T6 may be connected to the anode of the light emitting diode LED.

The seventh transistor T7 may have a p-type transistor characteristic, and may include a polycrystalline semiconductor. The seventh transistor T7 may function to initialize the anode of the light emitting diode LED. A gate electrode of the seventh transistor T7 may be connected to the bypass control line 154, a first region of the seventh transistor T7 may be connected to the anode of the light emitting diode LED, and a second region of the seventh transistor T7 may be connected to the second initialization voltage line 128. In case that the seventh transistor T7 is turned on by a low voltage of the bypass signal GB, the second initialization voltage VINT2 may be applied to the anode of the light emitting diode LED to be initialized.

The eighth transistor T8 may have a p-type transistor characteristic, and may include a polycrystalline semiconductor. A gate electrode of the eighth transistor T8 may be connected to the bypass control line 154, a first region of the eighth transistor T8 may be connected to the reference voltage line 156, and a second region of the eighth transistor T8 may be connected to the first region of the driving transistor T1. In case that the eighth transistor T8 is turned on by the low voltage of the bypass signal GB, the reference voltage VEH may be applied to the first region of the driving transistor T1.

It has been described above that a pixel (e.g., a single pixel) includes eight transistors T1 to T8 and one storage capacitor Cst, but embodiments are not limited thereto, and a number of transistors, a number of capacitors, and their connection relationships may be variously changed.

In an embodiment, the driving transistor T1 may include a polycrystalline semiconductor. For example, the third transistor T3 and the fourth transistor T4 may each include an oxide semiconductor. The second transistor T2, the fifth transistor T5, the sixth transistor T6, the seventh transistor T7, and the eighth transistor T8 may include a polycrystalline semiconductor. However, embodiments are not limited thereto, and at least one of the second transistor T2, the fifth transistor T5, the sixth transistor T6, the seventh transistor T7, and the eighth transistor T8 may include an oxide semiconductor. In an embodiment, more stable driving may be achieved and reliability may be improved by forming the third transistor T3 and the fourth transistor T4 of a semiconductor material that is different from the material of the driving transistor T1.

Hereinafter, planar and cross-sectional structures of the driving transistor T1, the third transistor T3, and the fourth transistor T4 will be further described with reference to FIG. 14 to FIG. 22.

Figure 15:
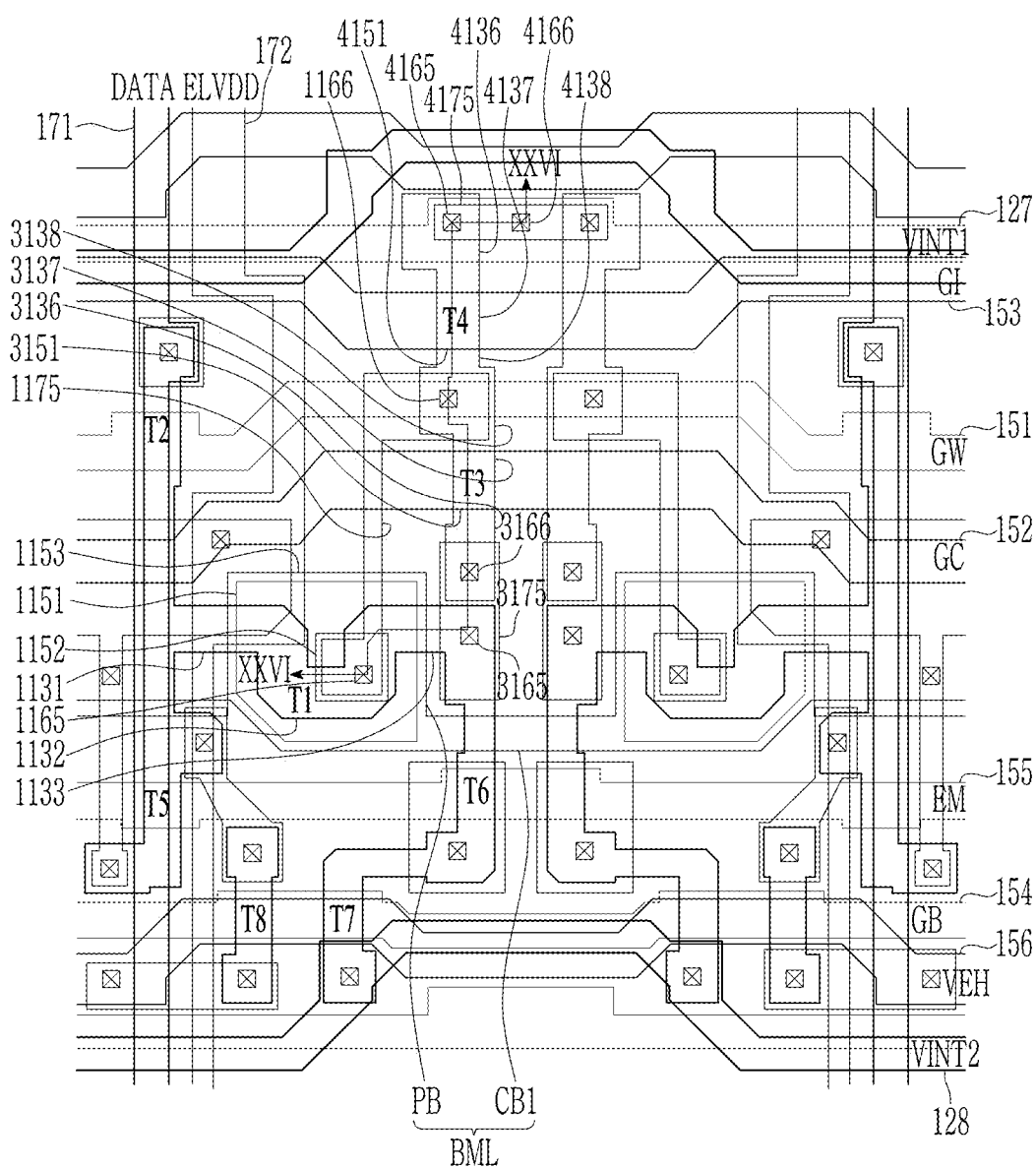
FIG. 15 illustrates a schematic top plan view of a display device according to an embodiment.
Figure 16:
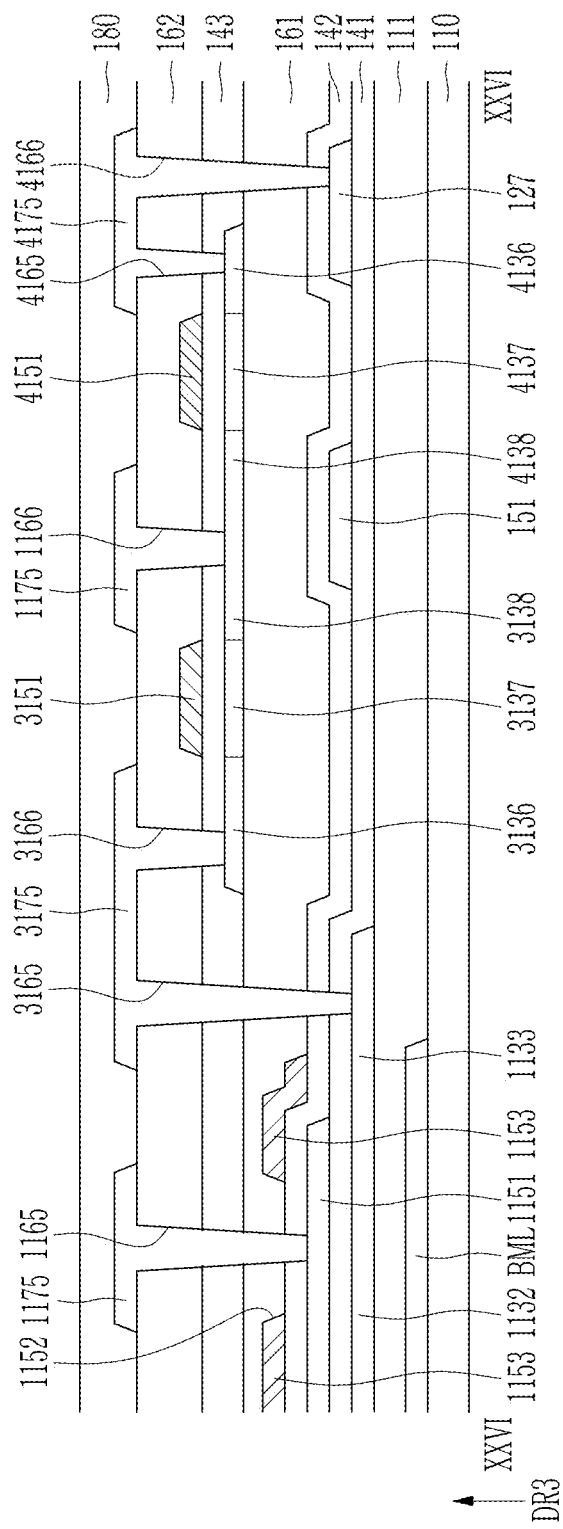
FIG. 16 illustrates a schematic cross-sectional view taken along line XXVI-XXVI' of FIG. 15.

FIG. 15 illustrates a schematic top plan view of a display device according to an embodiment, FIG. 16 illustrates a schematic cross-sectional view taken along line XXVI-XXVI' of FIG. 15, and FIG. 17 to FIG. 22 illustrate schematic top plan views sequentially showing a display device according to a manufacturing order thereof according to an embodiment. FIG. 15 to FIG. 22 illustrate two adjacent pixels, and the two pixels may have shapes that are symmetrical to each other. Hereinafter, a pixel positioned at a left side will be described for descriptive convenience.

As illustrated in FIG. 15 to FIG. 22, the light blocking layer BML may be positioned on the substrate 110.

Figure 17:
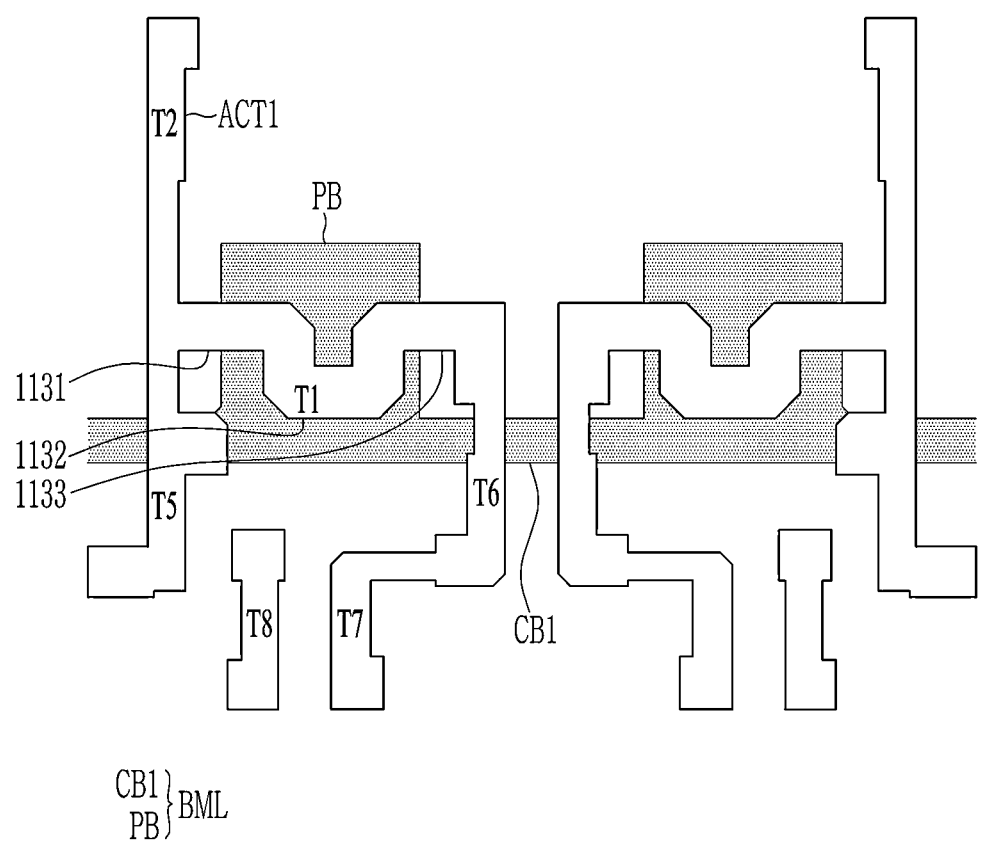
FIG. 17 to FIG. 22 illustrate schematic top plan views sequentially showing a display device according to a manufacturing order thereof according to an embodiment.

Referring to FIG. 16 and FIG. 17, the light blocking layer BML may be positioned to overlap a channel of the driving transistor T1.

The light blocking layer BML may include a flat plate portion PB overlapping the channel of the driving transistor T1 and a first connector CB1 connecting flat plate portions PB of neighboring pixels in the first direction DR1. For example, a second connector for connecting planar portions of neighboring pixels to each other in the second direction DR2 may be included.

A barrier layer 111 may be disposed on the light blocking layer BML. The barrier layer 111 include a silicon oxide ($SiO_x$), a silicon nitride ($SiN_x$), a silicon oxynitride ($SiO_xN_y$), or amorphous silicon (Si).

Referring to FIG. 16 and FIG. 17, a polycrystalline semiconductor layer ACT1 including a channel 1132, a first region 1131, and a second region 1133 of the driving transistor T1 may be positioned on the light blocking layer BML and the barrier layer 111. FIG. 17 illustrates the light blocking layer BML and a polycrystalline semiconductor layer ACT1. The polycrystalline semiconductor layer ACT1 may further include a channel, a first region, and a second region of each of not only the driving transistor T1 but also the second transistor T2, the fifth transistor T5, the sixth transistor T6, the seventh transistor T7, and the eighth transistor T8.

The channel 1132 of the driving transistor T1 may have a bent shape in a plan view. However, the shape of the channel 1132 of the driving transistor T1 is not limited thereto, and may be variously changed or modified. For example, the channel 1132 of the driving transistor T1 may be bent in a different shape, or may be formed in a bar-like shape. The first region 1131 and the second region 1133 of the driving transistor T1 may be positioned at opposite sides of the channel 1132 of the driving transistor T1. The first region 1131 of the driving transistor T1 may extend upward and downward in a plan view, a portion extending upward may be connected to the second region of the second transistor T2, and a portion extending downward may be connected to the second region of the fifth transistor T5. The second region 1133 of the driving transistor T1 may extend downward in a plan view to be connected to the first region of the sixth transistor T6.

A first gate insulating layer 141 may be disposed on the polycrystalline semiconductor layer ACT1 including the channel 1132, the first region 1131, and the second region 1133 of the driving transistor T1. The first gate insulating layer 141 may include a silicon nitride ($SiN_x$), a silicon oxide ($SiO_x$), or a silicon oxynitride ($SiO_xN_y$), and may have a single-layered structure or a multi-layered structure.

Figure 18:
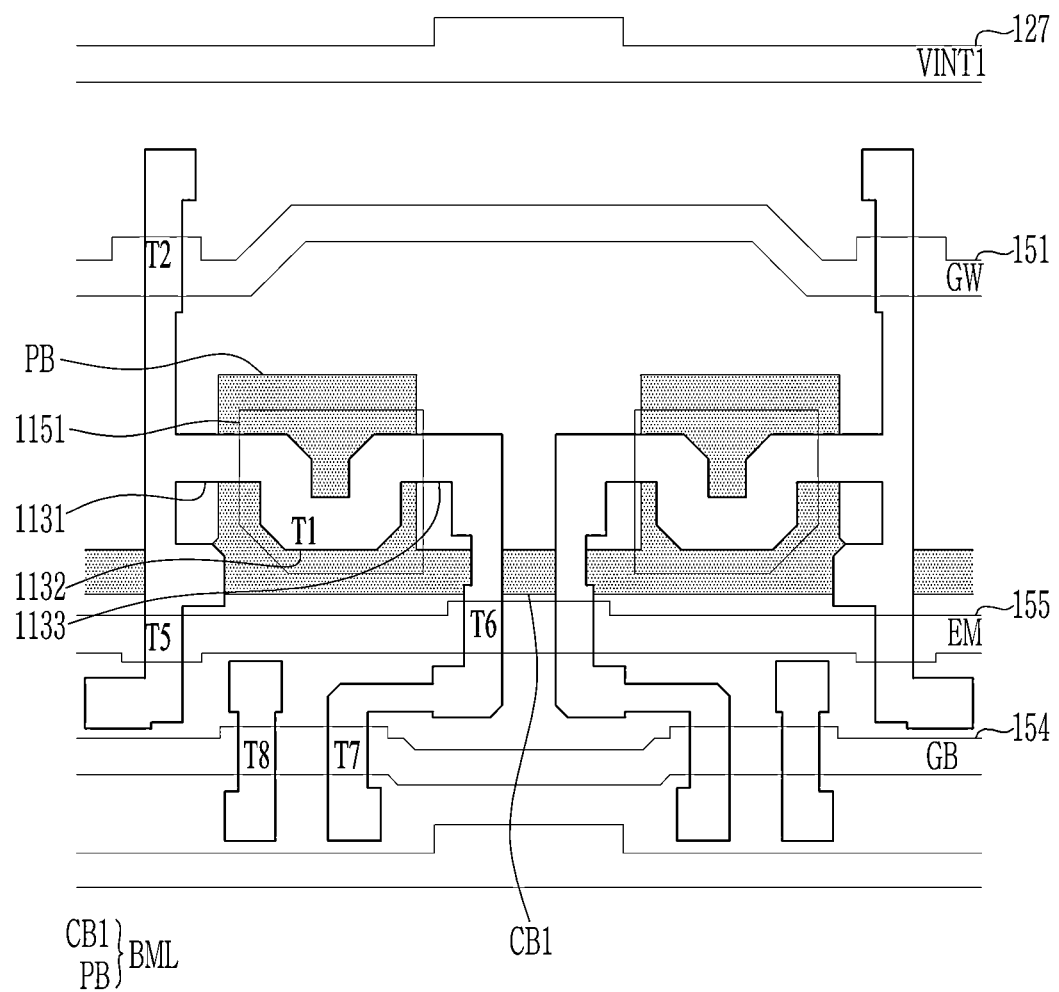

A first gate conductive layer including a gate electrode 1151 of the driving transistor T1 may be positioned on the first gate insulating layer 141. FIG. 18 illustrates a polycrystalline semiconductor layer and a first gate conductive layer. The first gate conductive layer may include molybdenum (Mo), aluminum (Al), copper (Cu), and/or titanium (Ti), and may have a single-layered structure or a multi-layered structure.

The gate electrode 1151 of the driving transistor T1 may overlap the channel 1132 of the driving transistor T1. The channel 1132 of the driving transistor T1 may overlap the gate electrode 1151 of the driving transistor T1.

The first gate conductive layer may further include a first initialization voltage line 127, a first scan line 151, an emission control line 155, and a bypass control line 154. The first initialization voltage line 127, the first scan line 151, the emission control line 155, and the bypass control line 154 may extend in a substantially horizontal direction. The first initialization voltage line 127 may be connected to the first region of the fourth transistor T4. The first scan line 151 may be connected to the gate electrode of the second transistor T2. The gate electrode of the fifth transistor T5 and the gate electrode of the sixth transistor T6 may be connected to the emission control line 155. The gate electrode of the seventh transistor T7 and the gate electrode of the eighth transistor T8 may be connected to the bypass control line 154.

After the first gate conductive layer including the gate electrode 1151 of the driving transistor T1 may be formed, a doping process may be performed. The polycrystalline semiconductor layer that is covered by the first conductive layer may be doped, and a portion of the polycrystalline semiconductor layer that is not covered by the first conductive layer may be doped to have a same characteristic as that of a conductor. For example, a doping process may be performed with a p-type dopant, and the driving transistor T1, the second transistor T2, the fifth transistor T5, the sixth transistor T6, the seventh transistor T7 including a polycrystalline semiconductor, and the eighth transistor T8 may have a p-type transistor characteristic.

A second gate insulating layer 142 may be disposed on the first gate insulating layer 141 and the first gate conductive layer including the gate electrode 1151 of the driving transistor T1. The second gate insulating layer 142 may include a silicon oxide ($SiO_x$), a silicon nitride ($SiN_x$), or a silicon oxynitride ($SiO_xN_y$), and may have a single-layered structure or a multi-layered structure.

Figure 19:
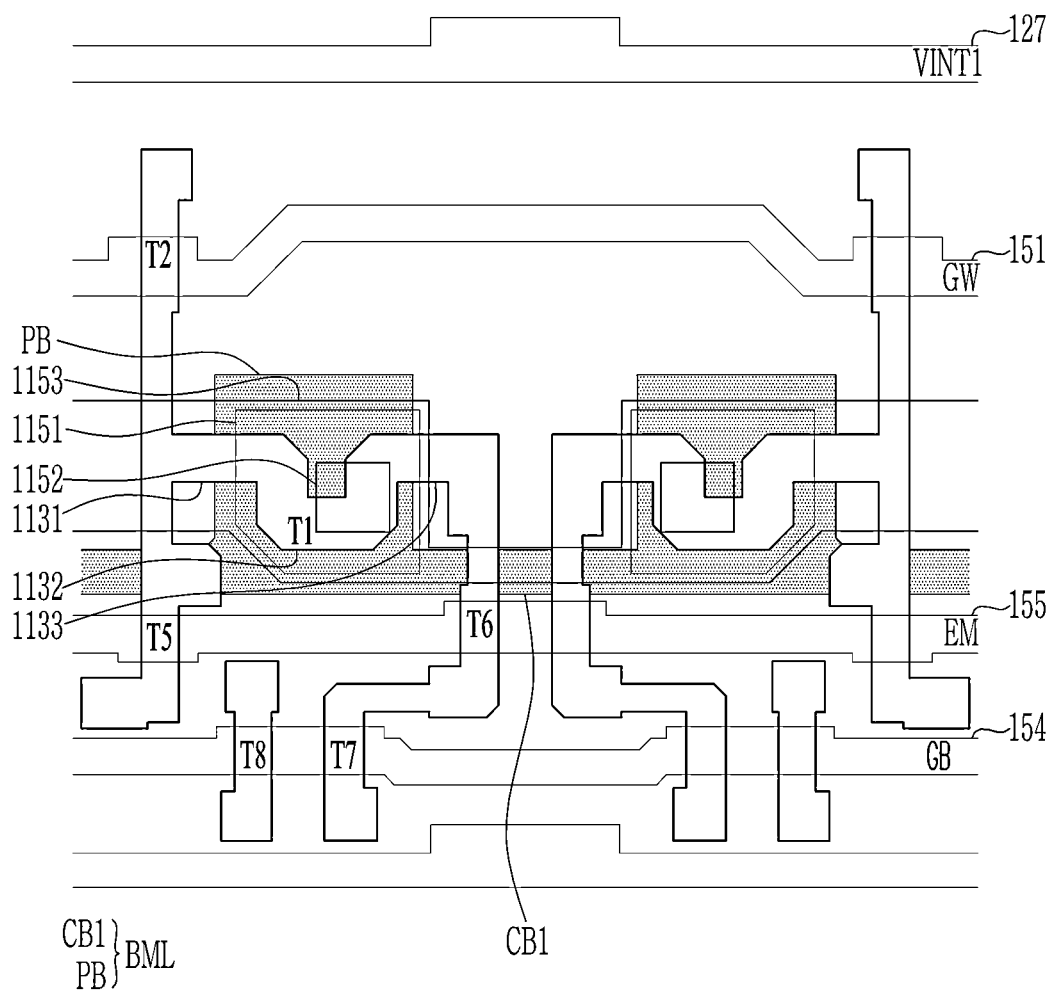

A second gate conductive layer including the first storage electrode 1153 of the storage capacitor Cst may be positioned on the second gate insulating layer 142. FIG. 19 illustrates the polycrystalline semiconductor layer, the first gate conductive layer, and the second gate conductive layer. The second gate conductive layer include molybdenum (Mo), aluminum (Al), copper (Cu) silver (Ag), chromium (Cr), tantalum (Ta), titanium (Ti), and the like, and may have a single-layered structure or a multi-layered structure.

The first storage electrode 1153 may overlap the gate electrode 1151 of the driving transistor T1 to constitute the storage capacitor Cst. An opening 1152 may be formed in the first storage electrode 1153 of the storage capacitor Cst. The opening 1152 of the first storage electrode 1153 of the storage capacitor Cst may overlap the gate electrode 1151 of the driving transistor T1.

A first interlayer insulating layer 161 may be disposed on the second gate conductive layer including the first storage electrode 1153 of the storage capacitor Cst. The first interlayer insulating layer 161 may include a silicon oxide ($SiO_x$), a silicon nitride ($SiN_x$), or a silicon oxynitride ($SiO_xN_y$), and may have a single-layered structure or a multi-layered structure.

Figure 20:
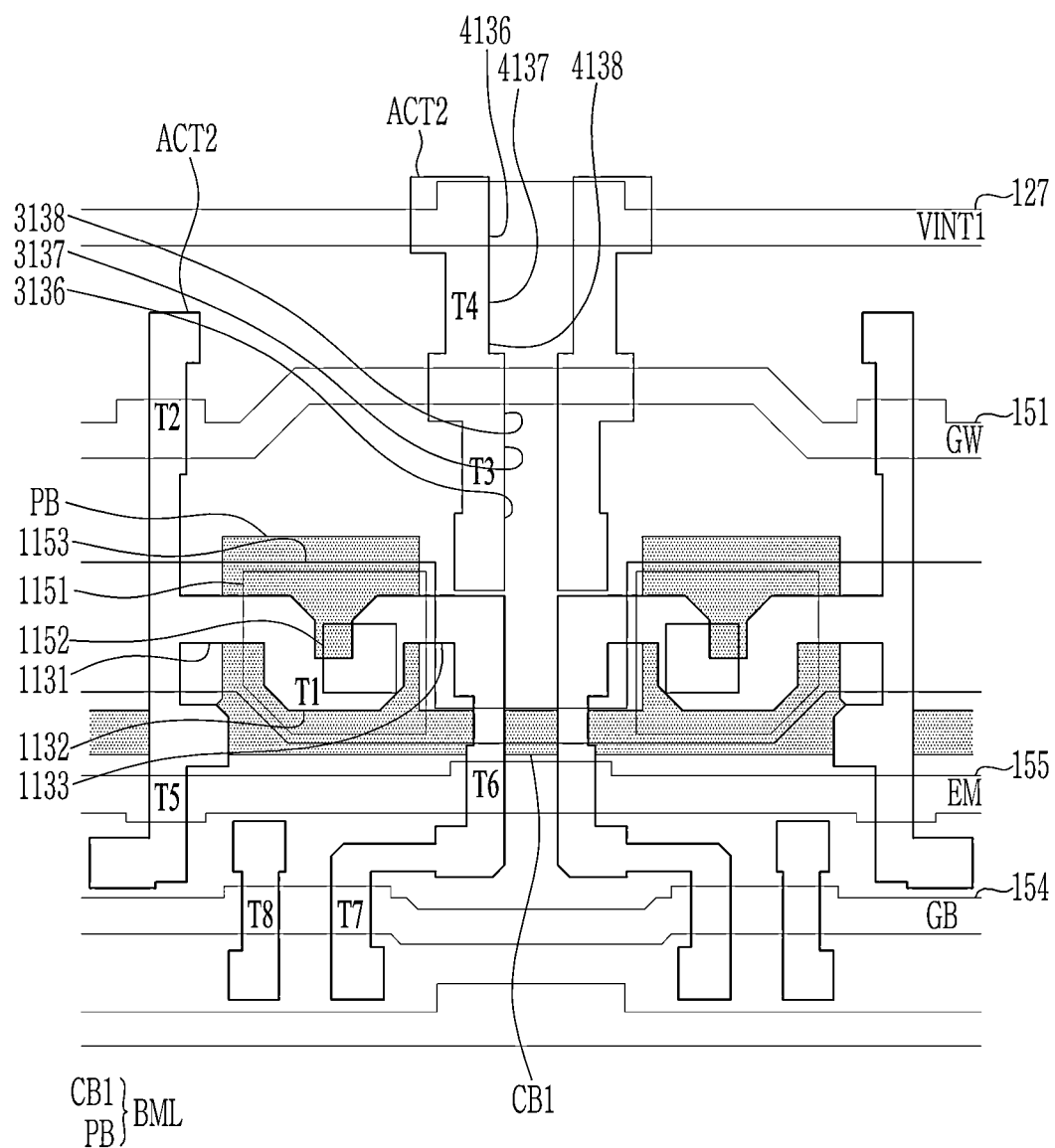

An oxide semiconductor layer ACT2 including the channel 3137, the first region 3136, and the second region 3138 of the third transistor T3, and the channel 4137, the first region 4136, and the second region 4138 of the fourth transistor T4, may be positioned on the first interlayer insulating layer 161. FIG. 20 illustrates the polycrystalline semiconductor layer, the first gate conductive layer, the second gate conductive layer, and an oxide semiconductor layer ACT2. The oxide semiconductor layer ACT2 may include an indium-gallium-zinc oxide (IGZO) among In—Ga—Zn-based oxides.

The channel 3137, the first region 3136, and the second region 3138 of the third transistor T3, and the channel 4137, the first region 4136, and the second region 4138 of the fourth transistor T4, may be connected to each other to be integral with each other. The first region 3136 and the second region 3138 of the third transistor T3 may be positioned at opposite sides of the channel 3137 of the third transistor T3. The first region 4136 and the second region 4138 of the fourth transistor T4 may be positioned at opposite sides of the channel 4137 of the fourth transistor T4. The second region 3138 of the third transistor T3 may be connected to the second region 4138 of the fourth transistor T4.

A third gate insulating layer 143 may be positioned on the oxide semiconductor layer ACT2 including the channel 3137, the first region 3136, and the second region 3138 of the third transistor T3, and the channel 4137, the first region 4136, and the second region 4138 of the fourth transistor T4. The third gate insulating layer 143 may include a silicon oxide ($SiO_x$), a silicon nitride ($SiN_x$), or a silicon oxynitride ($SiO_xN_y$), and may have a single-layered structure or a multi-layered structure.

The third gate insulating layer 143 may be positioned on entire surfaces of the oxide semiconductor layer and the first interlayer insulating layer 161. The third gate insulating layer 143 may cover upper surfaces and side surfaces of the channel 3137, the first region 3136, and the second region 3138 of the third transistor T3, and the channel 4137, the first region 4136, and the second region 4138 of the fourth transistor T4. However, embodiments are not limited thereto, and the third gate insulating layer 143 may not be positioned on entire surfaces of the oxide semiconductor layer and the first interlayer insulating layer 161. For example, the third gate insulating layer 143 may overlap the channel 3137 of the third transistor T3, and may not overlap the first region 3136 and the second region 3138. For example, the third gate insulating layer 143 may overlap the channel 4137 of the fourth transistor T4, and may not overlap the first region 4136 and the second region 4138.

Figure 21:
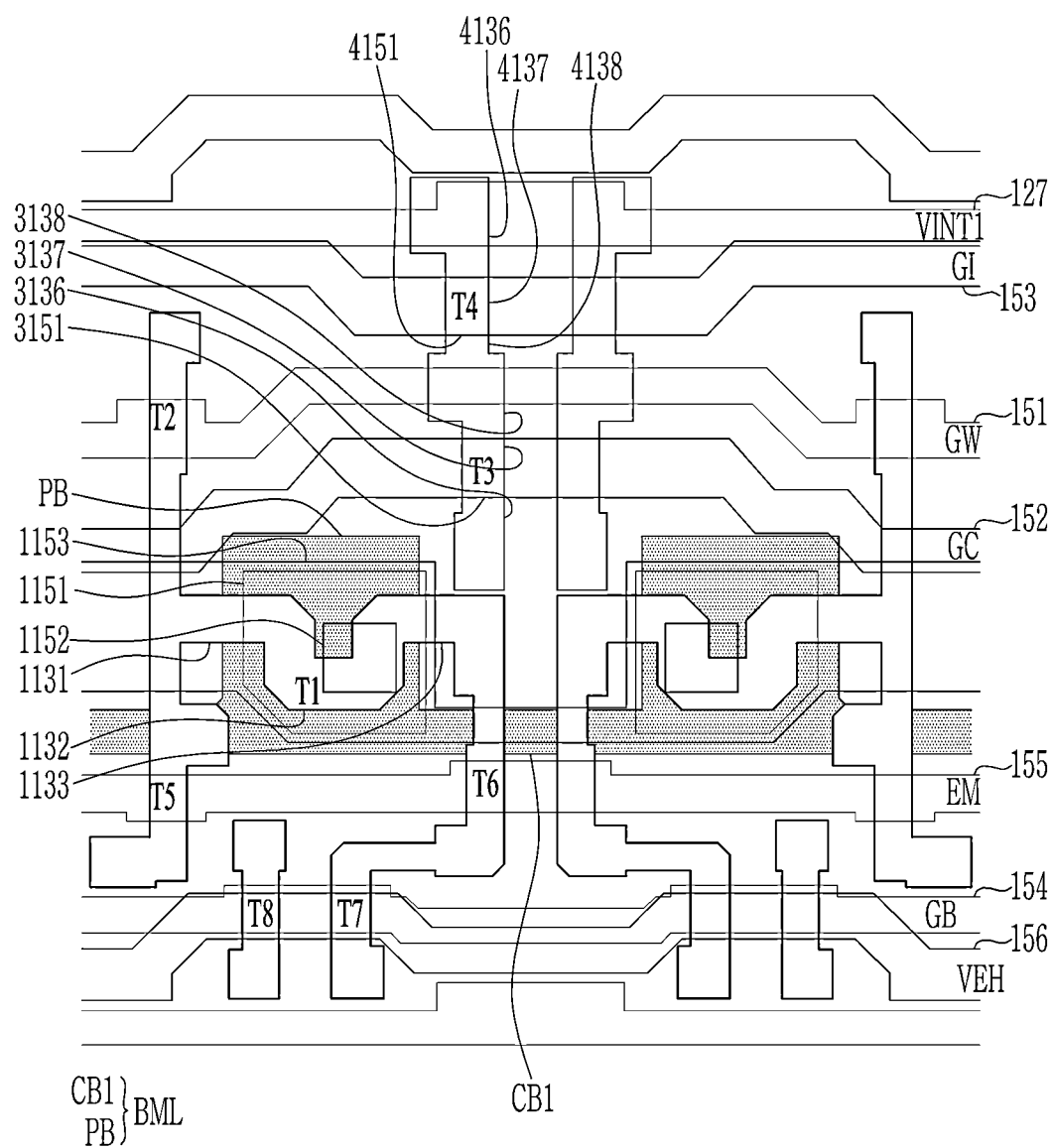

A third gate conductive layer including the gate electrode 3151 of the third transistor T3 and the gate electrode 4151 of the fourth transistor T4 may be positioned on the third gate insulating layer 143. FIG. 21 illustrates the polycrystalline semiconductor layer, the first gate conductive layer, the second gate conductive layer, the oxide semiconductor layer, and the third gate conductive layer. The third gate conductive layer may include molybdenum (Mo), aluminum (Al), copper (Cu), and/or titanium (Ti), and may have a single-layered structure or a multi-layered structure. For example, the third gate conductive layer may include a lower layer including titanium and an upper layer including molybdenum.

The gate electrode 3151 of the third transistor T3 may overlap the channel 3137 of the third transistor T3. The gate electrode 4151 of the fourth transistor T4 may overlap the channel 4137 of the fourth transistor T4.

The third gate conductive layer may further include an initialization control line 153, a second scan line 152, and a reference voltage line 156. The initialization control line 153, the second scan line 152, and the reference voltage line 156 may extend substantially in a horizontal direction. The initialization control line 153 may be connected to the gate electrode 4151 of the fourth transistor T4. The second scan line 152 may be connected to the gate electrode 3151 of the third transistor T3. The reference voltage line 156 may be connected to the first region of the eighth transistor T8.

After the third gate conductive layer including the gate electrode 3151 of the third transistor T3 and the gate electrode 4151 of the fourth transistor T4 is formed, a doping process may be performed. A portion of the oxide semiconductor layer covered by the third gate conductive layer may not be doped, and a portion of the oxide semiconductor layer not covered by the third gate conductive layer may be doped to have a same characteristic as the conductor. The channel 3137 of the third transistor T3 may be positioned under the gate electrode 3151 to overlap the gate electrode 3151. The first region 3136 and the second region 3138 of the third transistor T3 may not overlap the gate electrode 3151. The channel 4137 of the fourth transistor T4 may be positioned under the gate electrode 4151 to overlap the gate electrode 4151. The first region 4136 and the second region 4138 of the fourth transistor T4 may not overlap the gate electrode 4151. The doping process of the oxide semiconductor layer may be performed with an N-type dopant, and the third transistor T3 and the fourth transistor T4 including the oxide semiconductor layer may have an N-type transistor characteristic.

A second interlayer insulating layer 162 may be positioned on the third gate conductive layer including the gate electrode 3151 of the third transistor T3 and the gate electrode 4151 of the fourth transistor T4. The second interlayer insulating layer 162 may include a silicon nitride ($SiN_x$), a silicon oxide ($SiO_x$), or a silicon oxynitride ($SiO_xN_y$), and may have a single-layered structure or a multi-layered structure. The second interlayer insulating layer 162 may include a first opening 1165, a second opening 1166, a third opening 3165, a fourth opening 3166, a fifth opening 4165, and a sixth opening 4166.

The first opening 1165 may overlap at least a portion of the gate electrode 1151 of the driving transistor T1. The first opening 1165 may be further formed on the third gate insulating layer 143, the first interlayer insulating layer 161, and the second gate insulating layer 142. The first opening 1165 may overlap the opening 1152 of the first storage electrode 1153. The first opening 1165 may be positioned inside the opening 1152 of the first storage electrode 1153. The second opening 1166 may overlap at least a portion of the second region 3138 of the third transistor T3. The second opening 1166 may be further formed in the third gate insulating layer 143.

The third opening 3165 may overlap at least a portion of the second region 1133 of the driving transistor T1. The third opening 3165 may be further formed in the third gate insulating layer 143, the first interlayer insulating layer 161, the second gate insulating layer 142, and the first gate insulating layer 141. The fourth opening 3166 may overlap at least a portion of the first region 3136 of the third transistor T3. The fourth opening 3166 may be further formed in the third gate insulating layer 143.

The fifth opening 4165 may overlap at least a portion of the first region 4136 of the fourth transistor T4. The fifth opening 4165 may be further formed in the third gate insulating layer 143. The sixth opening 4166 may overlap at least a portion of the first initialization voltage line 127. The sixth opening 4166 may be further formed on the third gate insulating layer 143, the first interlayer insulating layer 161, and the second gate insulating layer 142.

Figure 22:
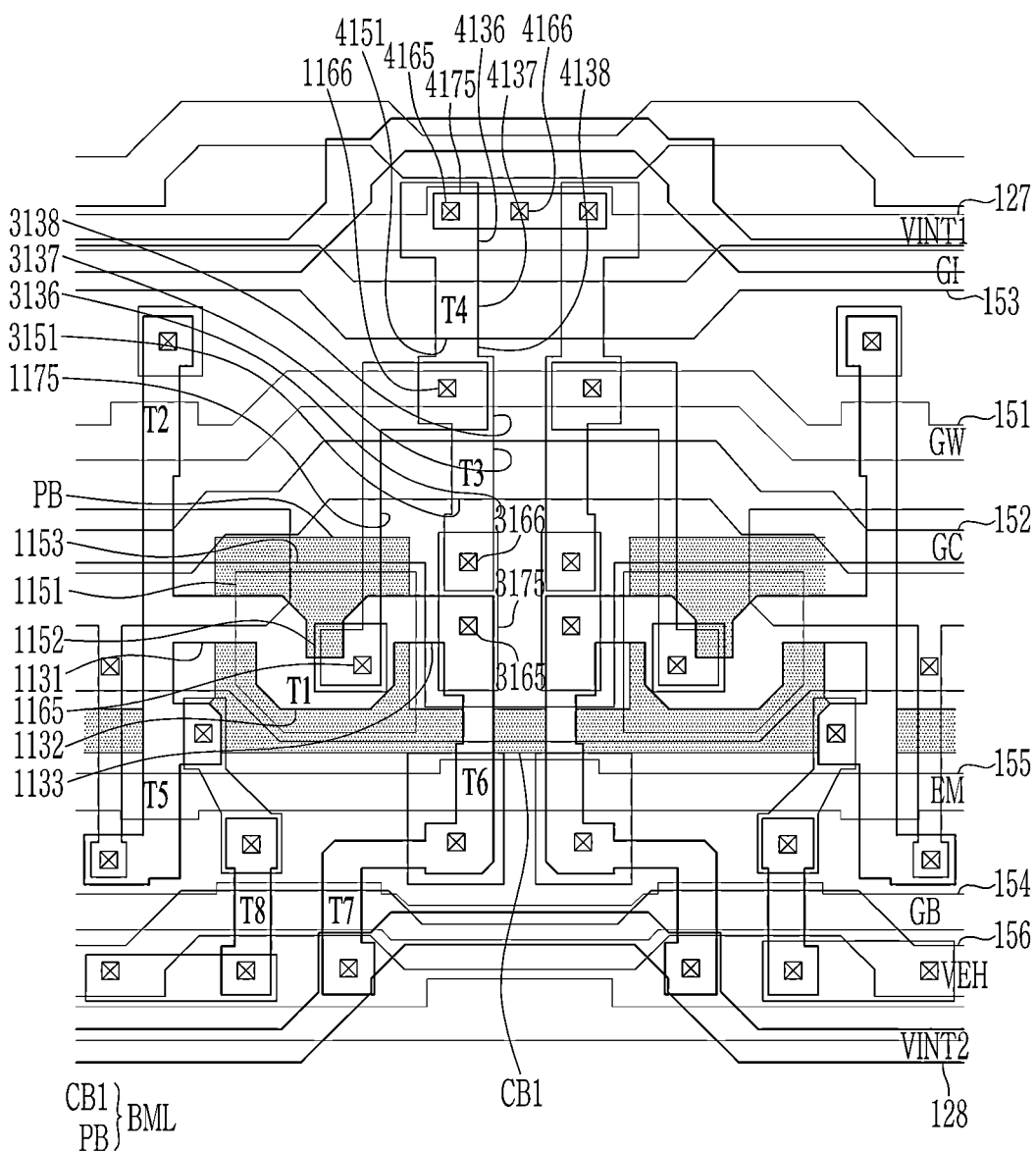

A first data conductive layer including a first connection electrode 1175, a second connection electrode 3175, and a third connection electrode 4175 may be positioned on the second interlayer insulating layer 162. FIG. 22 illustrates the polycrystalline semiconductor layer, the first gate conductive layer, the second gate conductive layer, the oxide semiconductor layer, the third gate conductive layer, and the first data conductive layer. The first data conductive layer may include aluminum (Al), platinum (Pt), palladium (Pd), silver (Ag), magnesium (Mg), gold (Au), nickel (Ni), neodymium (Nd), iridium (Ir), chromium (Cr), nickel (Ni), calcium (Ca), molybdenum (Mo), tantalum (Ta), titanium (Ti), tungsten (W), copper (Cu), and/or the like, and may have a single layer structure or a multi-layered structure including the material. For example, the first data conductive layer may have a triple-layered structure of a lower film including a refractory metal such as molybdenum, chromium, tantalum, or titanium, or an alloy thereof, an intermediate film including an aluminum-based metal, a silver-based metal, or a copper-based metal having low resistivity, and an upper film including a refractory metal such as molybdenum, chromium, tantalum, or titanium.

The first connection electrode 1175 may overlap the gate electrode 1151 of the driving transistor T1. The first connection electrode 1175 may be connected to the gate electrode 1151 of the driving transistor T1 through the first opening 1165 and the opening 1152 of the first storage electrode 1153. The first connection electrode 1175 may overlap the second region 3138 of the third transistor T3. The first connection electrode 1175 may be connected to the second region 3138 of the third transistor T3. Accordingly, the gate electrode 1151 of the driving transistor T1 and the second region 3138 of the third transistor T3 may be connected by the first connection electrode 1175.

The second connection electrode 3175 may overlap the second region 1133 of the driving transistor T1. The second connection electrode 3175 may be connected to the second region 1133 of the driving transistor T1 through the third opening 3165. The second connection electrode 3175 may overlap the first region 3136 of the third transistor T3. The second connection electrode 3175 may be connected to the first region 3136 of the third transistor T3 through the fourth opening 3166. Accordingly, the second region 1133 of the driving transistor T1 and the first region 3136 of the third transistor T3 may be connected by the second connection electrode 3175.

The third connection electrode 4175 may overlap the first region 4136 of the fourth transistor T4. The third connection electrode 4175 may be connected to the first region 4136 of the fourth transistor T4 through the fifth opening 4165. The third connection electrode 4175 may overlap the first initialization voltage line 127. The third connection electrode 4175 may be connected to the first initialization voltage line 127 through the sixth opening 4166. Accordingly, the first region 4136 of the fourth transistor T4 and the first initialization voltage line 127 may be connected by the third connection electrode 4175.

The first data conductive layer may further include a second initialization voltage line 128. The second initialization voltage line 128 may extend substantially in the horizontal direction. The second initialization voltage line 128 may be connected to the second region of the seventh transistor T7.

A third interlayer insulating layer 180 may be positioned on the first data conductive layer including the first connection electrode 1175, the second connection electrode 3175, and the third connection electrode 4175. The third interlayer insulating layer 180 may include an organic insulating material such as a general purpose polymer, e.g., poly (methyl methacrylate) (PMMA) or polystyrene (PS), a polymer derivative having a phenolic group, an acrylic polymer, an imide polymer, a polyimide, a siloxane polymer, etc.

A second data conductive layer including the data line 171 and the driving voltage line 172 may be disposed on the third interlayer insulating layer 180. The second data conductive layer may include aluminum (Al), platinum (Pt), palladium (Pd), silver (Ag), magnesium (Mg), gold (Au), nickel (Ni), neodymium (Nd), iridium (Ir), chromium (Cr), nickel (Ni), calcium (Ca), molybdenum (Mo), tantalum (Ta), titanium (Ti), tungsten (W), copper (Cu), and/or the like, and may have a single layer structure or a multi-layered structure including the material.

The data line 171 and the driving voltage line 172 may extend in the vertical direction. The data line 171 may be connected to the second transistor T2. The data line 171 may be connected to the first region of the second transistor T2. The driving voltage line 172 may be connected to the fifth transistor T5. The driving voltage line 172 may be connected to the first region of the fifth transistor T5. The driving voltage line 172 may be connected to the storage capacitor Cst. The driving voltage line 172 may be connected to the first storage electrode 1153 of the storage capacitor Cst. The first storage electrodes 1153 of the storage capacitors Cst of adjacent pixels may be connected to each other, and may extend in a substantially horizontal direction.

For example, a passivation layer may be positioned on the second data conductive layer including the data line 171 and the driving voltage line 172, and an anode of a light emitting diode LED may be positioned on the passivation layer. The anode of the light emitting diode LED may be connected to the sixth transistor T6, and may receive an output current of the driving transistor T1. A partition wall may be positioned on the anode of the light emitting diode LED. An opening may be formed in the partition wall, and the opening of the partition wall may overlap the anode of the light emitting diode LED. A light emitting diode layer may be disposed within the opening of the partition wall. A cathode may be positioned on the light emitting element layer and the partition wall. The anode, the light emitting diode layer, and the cathode may constitute the light emitting diode LED.

As described above, in the display area of the display device according to an embodiment, the driving transistor T1 may include a polycrystalline semiconductor, and the third transistor T3 and the fourth transistor T4 may include an oxide semiconductor. As described above, more stable driving may be achieved and reliability may be improved by allowing the third transistor T3 and the fourth transistor T4 to include a semiconductor material that is different from that of the driving transistor T1.

Although positions of transistors included in one pixel and a wire connected thereto in a plan view and in a cross-sectional view have been described above, embodiments are not limited thereto. Positions of each constituent element in a plan view and in a cross-sectional view may be variously changed.

In concluding the detailed description, those skilled in the art will appreciate that many variations and modifications may be made to the embodiments without substantially departing from the principles and spirit and scope of the disclosure. Therefore, the disclosed embodiments are used in a generic and descriptive sense only and not for purposes of limitation.

What is claimed is:
1. A display device comprising:
   a substrate including a display area and a non-display area;
   a light blocking layer disposed on the substrate; and a semiconductor layer disposed on the light blocking layer, wherein the light blocking layer includes:
- a plurality of flat plate portions disposed in the display area;
- a first connector connected to the flat plate portions in a first direction;
- a second connector connected to the flat plate portions in a second direction perpendicular to the first direction; and
- an outer portion disposed in the non-display area, and the first connector and the outer portion are directly connected to each other, and a width of the outer portion is greater than a width of the first connector.

2. The display device of claim 1, wherein the outer portion has a ring shape surrounding the display area.

3. The display device of claim 1, wherein the second connector is not directly connected to the outer portion.

4. The display device of claim 1, wherein the plurality of flat plate portions of the light blocking layer overlaps the semiconductor layer in a thickness direction of the substrate.

5. The display device of claim 1, further comprising:
dummy pixels disposed at opposite edges of the display area in the first direction; and
pixels disposed between the dummy pixels in the first direction.

6. The display device of claim 1, wherein a width of the outer portion is in a range of about 250 µm to about 350 µm.

7. The display device of claim 1, wherein a width of the first connector is in a range of about 30 µm to about 80 µm.

8. The display device of claim 1, further comprising:
a driving voltage line overlapping the outer portion.

9. The display device of claim 8, wherein a width of the driving voltage line is in a range of about 250 µm to about 350 µm.

10. The display device of claim 8, wherein a width of the outer portion is greater than or equal to a width of the driving voltage line.

11. The display device of claim 8, further comprising:
an insulating layer disposed between the outer portion and the driving voltage line, wherein
the outer portion and the driving voltage line are electrically connected through a first opening of the insulating layer, and
the outer portion receives a driving voltage.

12. The display device of claim 11, further comprising:
an outer semiconductor layer disposed between the outer portion and the driving voltage line.

13. The display device of claim 12, wherein the outer semiconductor layer does not overlap the first opening of the insulating layer.

14. The display device of claim 13, wherein
the outer semiconductor layer has a second opening, and
the first opening of the insulating layer overlaps the second opening of the outer semiconductor layer.

15. The display device of claim 14, wherein a distance between the second opening of the outer semiconductor layer and an edge of the outer semiconductor layer is in a range of about 3 µm to about 5 µm.

16. The display device of claim 14, wherein a distance between the first opening of the insulating layer and the second opening of the outer semiconductor layer is in a range of about 3 µm to about 5 µm.

17. The display device of claim 12, wherein a width of the outer semiconductor layer is in a range of about 20 µm to about 40 µm.

18. The display device of claim 1, wherein the semiconductor layer includes a polycrystalline semiconductor layer.

19. The display device of claim 18, further comprising:
an oxide semiconductor layer disposed in the display area.

20. The display device of claim 1, further comprising:
a wire overlapping the outer portion.

* * * * *